(12) United States Patent
Furutani et al.

(10) Patent No.: US 8,178,790 B2
(45) Date of Patent: May 15, 2012

(54) INTERPOSER AND METHOD FOR MANUFACTURING INTERPOSER

(75) Inventors: Toshiki Furutani, Gifu (JP); Atsushi Sakai, Gifu (JP); Kiyohisa Hasegawa, Kawasaki (JP); Hiroshi Segawa, Kawasaki (JP); Shuichi Kawano, Kawasaki (JP); Hajime Sakamoto, Kawasaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 674 days.

(21) Appl. No.: 12/336,697

(22) Filed: Dec. 17, 2008

(65) Prior Publication Data
US 2009/0231827 A1    Sep. 17, 2009

Related U.S. Application Data

(60) Provisional application No. 61/036,638, filed on Mar. 14, 2008.

(51) Int. Cl.
*H05K 1/11* (2006.01)
(52) U.S. Cl. ........ 174/261; 174/263; 361/760; 361/803; 361/794
(58) Field of Classification Search .................. 361/760, 361/767, 768, 771, 777, 778, 803.79, 792, 361/794, 795, 803, 735, 736, 739, 746; 174/250, 174/255–258, 260–262
See application file for complete search history.

(56) References Cited

U.S. PATENT DOCUMENTS

| | | | |
|---|---|---|---|
| 7,088,000 B2 * | 8/2006 | Cranmer et al. | 257/767 |
| 7,738,258 B2 * | 6/2010 | Ohno et al. | 361/767 |
| 2001/0011571 A1 * | 8/2001 | Farooq et al. | 156/89.12 |
| 2005/0139384 A1 * | 6/2005 | Suzuki et al. | 174/255 |
| 2007/0125575 A1 * | 6/2007 | Inui et al. | 174/262 |
| 2008/0093117 A1 * | 4/2008 | Oikawa et al. | 174/262 |
| 2008/0100291 A1 * | 5/2008 | Mayder | 324/254 |
| 2009/0008142 A1 * | 1/2009 | Shimizu et al. | 174/261 |
| 2009/0046441 A1 * | 2/2009 | Funaya et al. | 361/783 |

FOREIGN PATENT DOCUMENTS

| | | |
|---|---|---|
| JP | 2005-317705 | 11/2005 |
| JP | 2006-19368 | 1/2006 |

\* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

An interposer and a method of manufacturing the same are provided. The interposer includes a substrate and a conductor portion formed inside the substrate. At least one insulating layer is formed on the substrate and on the conductor portion. A signal wiring portion is formed inside the insulating layer or on the insulating layer. A first pad is configured to receive an electronic part, and is formed on an outermost insulating layer of the at least one insulating layer. A connection conductor is formed in the at least one insulating layer so as to electrically connect the conductor portion to the first pad.

15 Claims, 33 Drawing Sheets

FIG. 5
(a) 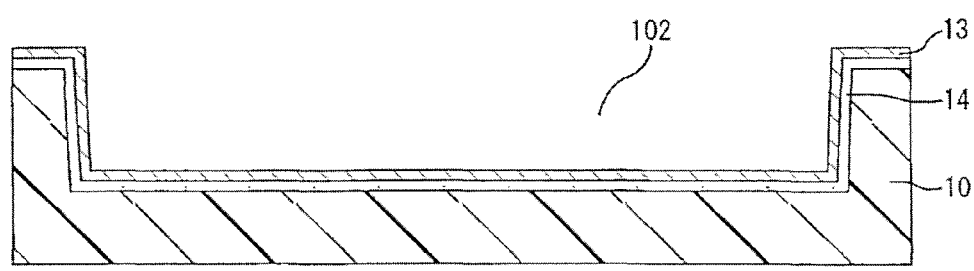
(b) 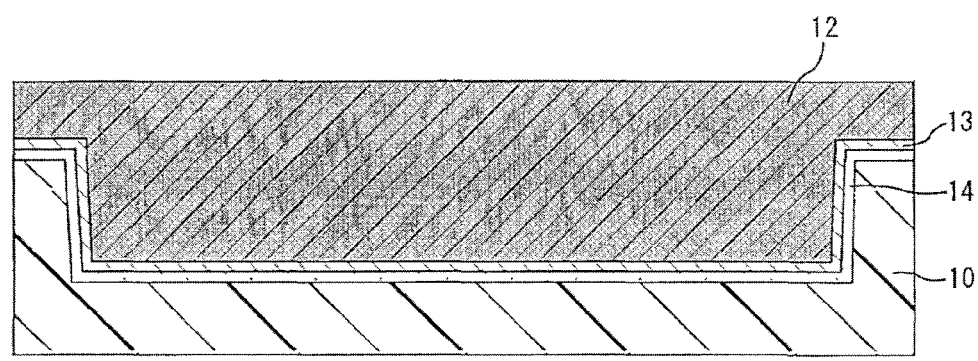
(c) 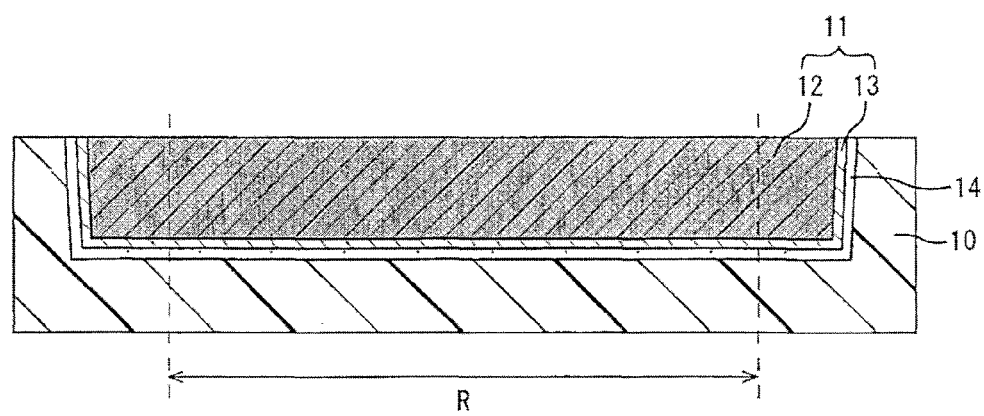

FIG. 12
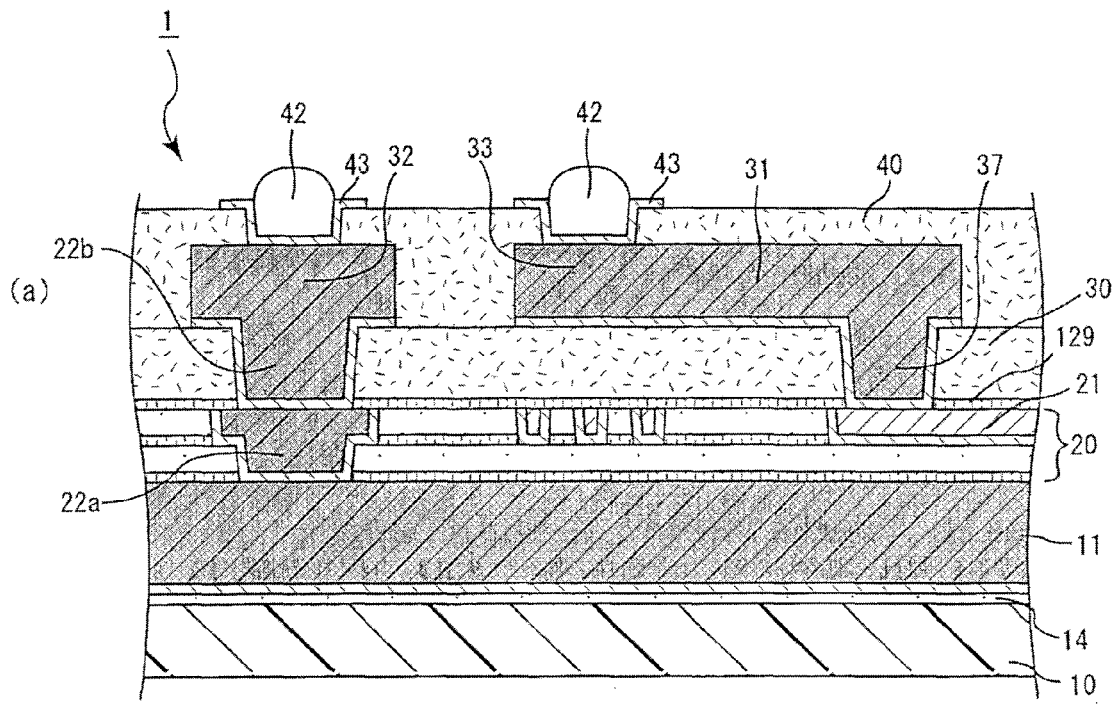
(a)
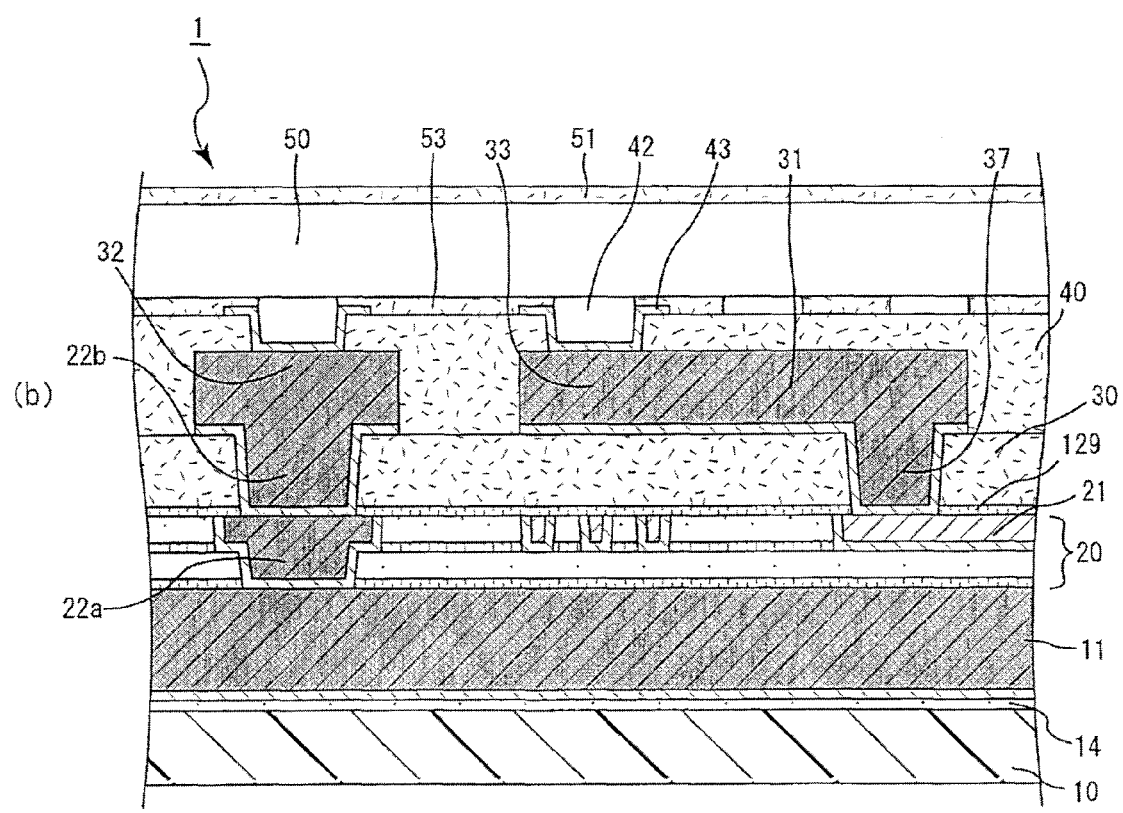
(b)

FIG. 29
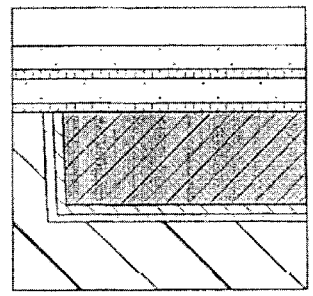
(a)
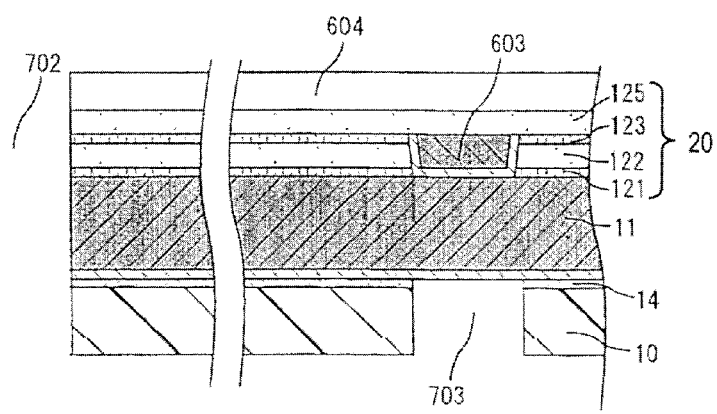
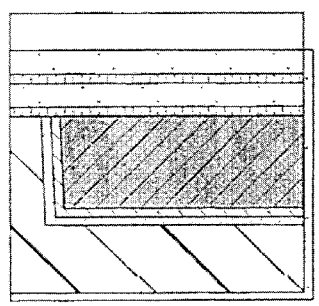
(b)
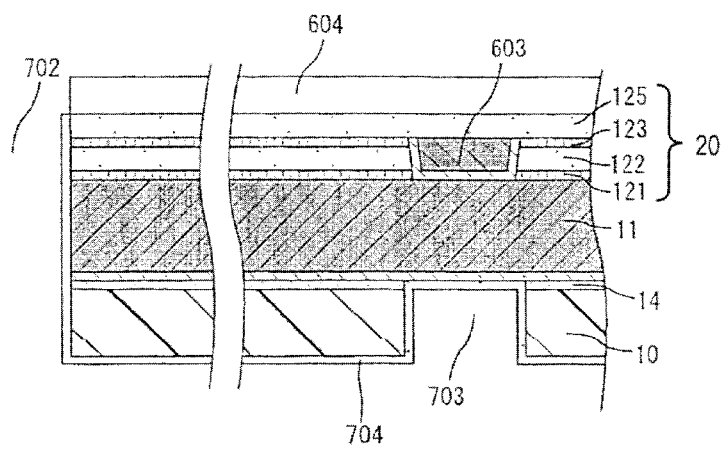
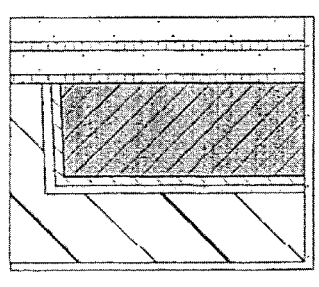
(c)
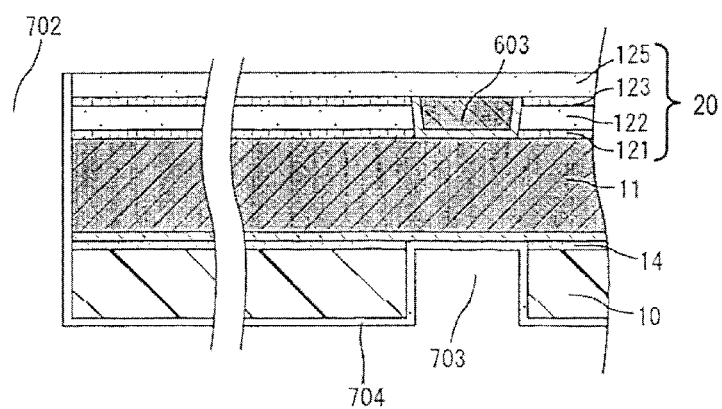

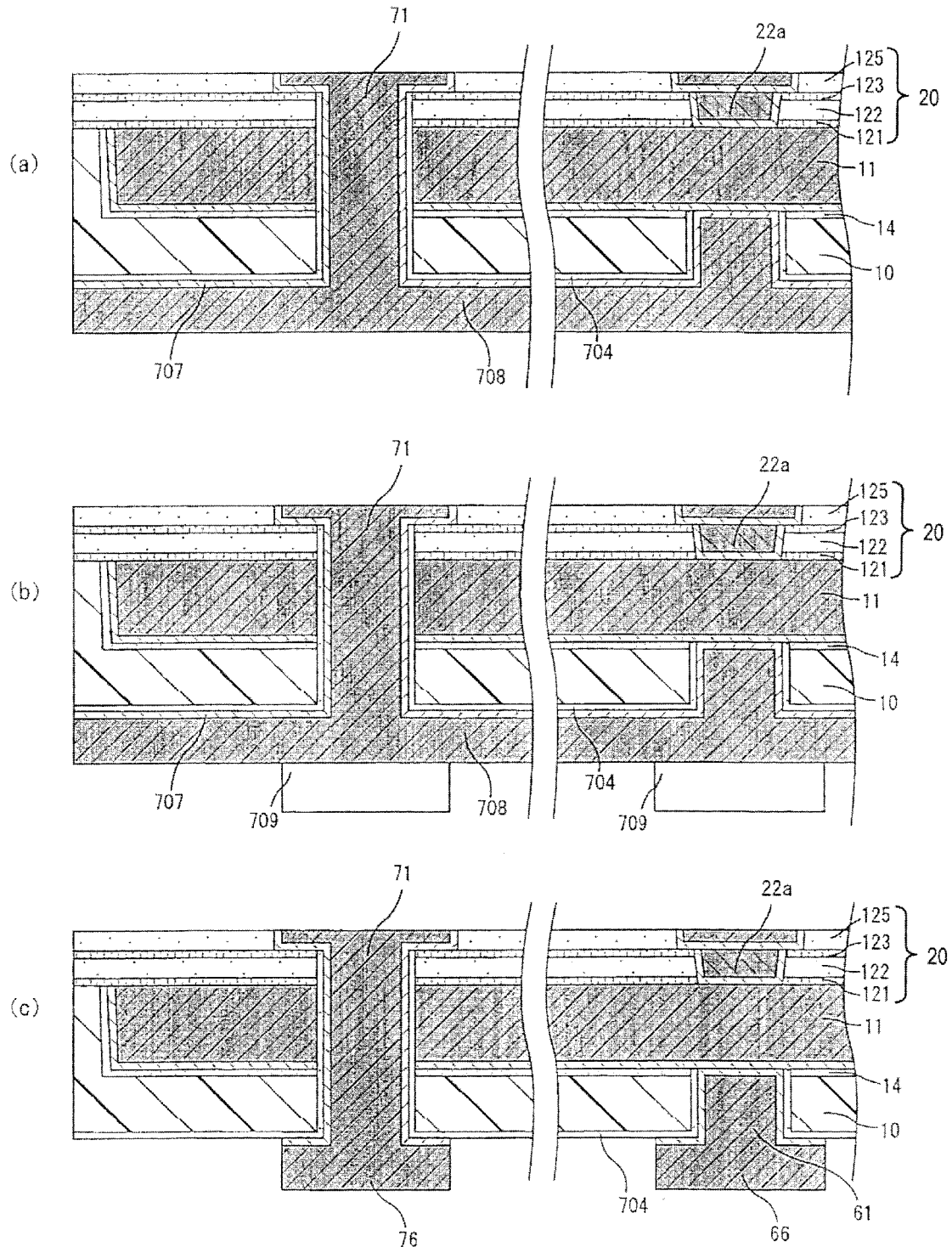

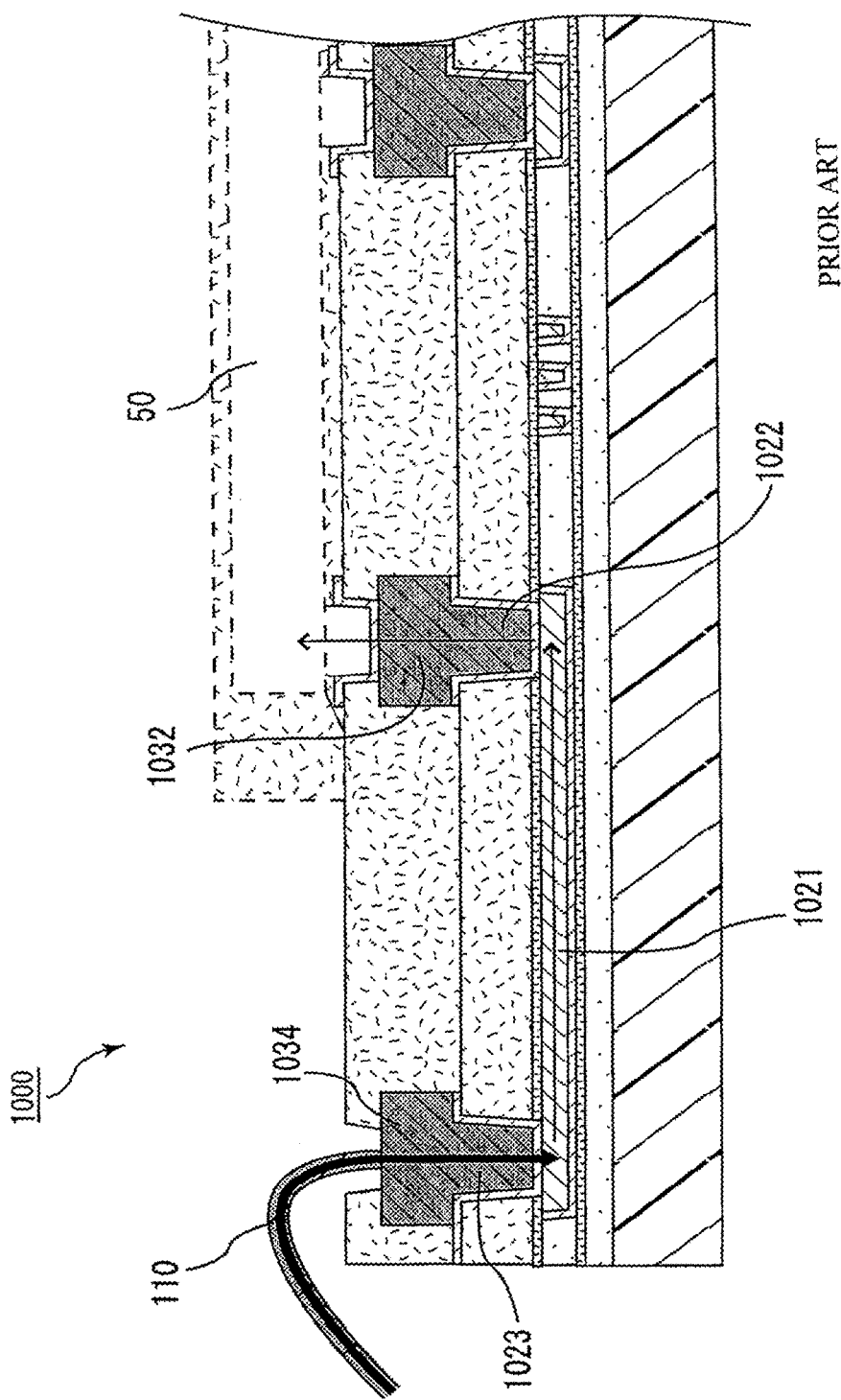

US 8,178,790 B2

INTERPOSER AND METHOD FOR MANUFACTURING INTERPOSER

CROSS-REFERENCE TO RELATED APPLICATIONS

The present application claims the benefit of priority to U.S. Application No. 61/036,638, filed Mar. 14, 2008. The contents of that application are incorporated herein by reference in their entirety.

BACKGROUND OF THE INVENTION

1. Field of the Invention

The present invention relates to an interposer and a method of manufacturing an interposer.

2. Discussion of the Background

A substrate referred to as interposer is used as an intermediate substrate for mounting a semiconductor element such as logic and memory. Such an interposer is inserted between a wiring substrate such as a package substrate and a semiconductor element such as logic and memory to be loaded onto said wiring substrate to constitute a semiconductor device.

Japanese Patent Publication No. 2006-19368 discloses an interposer in which an inorganic insulating layer composed of $SiO_2$ is formed on a silicon substrate and a wiring is formed on the surface of that inorganic insulating layer. The contents of this publication are incorporated herein by reference in their entirety.

SUMMARY OF THE INVENTION

In one example aspect, an interposer is provided. The interposer includes a substrate and a conductor portion formed inside the substrate. At least one insulating layer is formed on the substrate and on the conductor portion. A signal wiring portion is formed inside the insulating layer or on the insulating layer. A first pad is configured to receive an electronic part, and is formed on an outermost insulating layer of the at least one insulating layer. A connection conductor is formed in the at least one insulating layer so as to electrically connect the conductor portion to the first pad.

In another exemplary aspect, a method for manufacturing an interposer is provided. The method includes providing a substrate and forming an indented portion in the substrate. A conductor portion is formed in the indented portion, and at least one insulating layer is formed on the substrate and on the conductor portion. The method further includes forming a first pad on an outermost layer of the at least one insulating layer and concurrently forming a connection conductor in the at least one insulating layer so as to electrically connect the first pad and the conductor portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5(a)-(c) are sectional views illustrating schematically a portion of the manufacturing process of an interposer in accordance with the first exemplary aspect.

FIGS. 7(a)-(c) are sectional views illustrating schematically a portion of the manufacturing process of an interposer in accordance with the first exemplary aspect.

FIGS. 12(a) and (b) are sectional views illustrating schematically an example of mounting an interposer in accordance with the first exemplary aspect.

FIGS. 27(a)-(c) are sectional views illustrating schematically a portion of the manufacturing process of an interposer in accordance with the fifth exemplary aspect.

FIGS. 29(a)-(c) are sectional views illustrating schematically a portion of the manufacturing process of an interposer in accordance with the fifth exemplary aspect.

FIGS. 32(a)-(c) are sectional views illustrating schematically a portion of the manufacturing process of an interposer in accordance with the fifth exemplary aspect.

FIG. 33 is a sectional view illustrating schematically one example of wiring inside an interposer.

DETAILED DESCRIPTION OF THE PREFERRED EXEMPLARY ASPECTS

Figure 1:
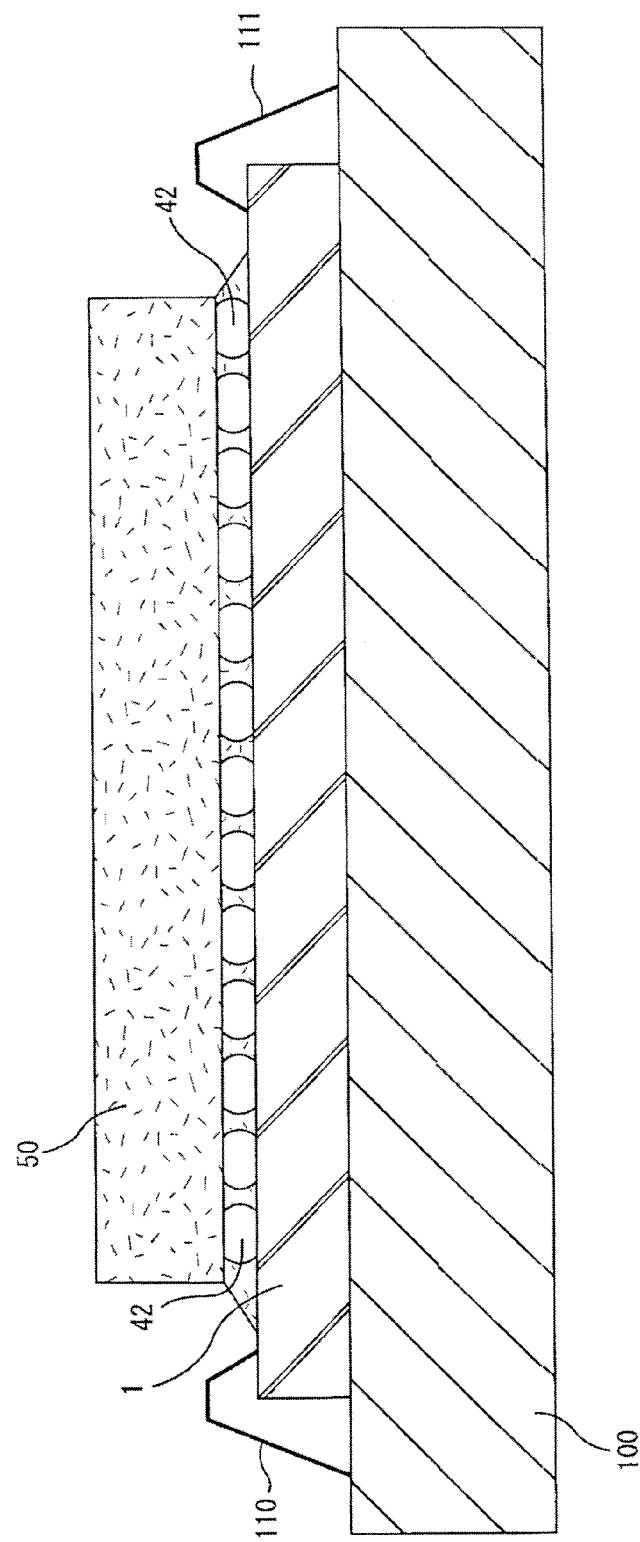
FIG. 1 is a sectional view illustrating schematically an example of an interposer in accordance with a first exemplary aspect.

Ordinarily, when it comes to a semiconductor device having a wiring substrate such as a package substrate, an interposer, and a semiconductor element, a voltage supplied from a power circuit such as a DC-DC converter is applied to a semiconductor element via an interposer. In order for a semiconductor element to normally exhibit its function, a supply voltage within a range suitable for the semiconductor element needs to be momentarily applied. However, the adjustment of supply voltage in a semiconductor device is undertaken mainly by the control of the service voltage in the power circuit, and the supply voltage applied to a semiconductor element is not directly monitored.

When measuring the supply voltage applied to the semiconductor element and the wiring substrate, there are occasions when the supply voltage applied to the semiconductor element is low as compared to the supply voltage on the wiring substrate. The lower supply voltage applied to the semiconductor element interferes with a normal operation of the semiconductor element. Accordingly, a supply voltage drop should be controlled.

FIG. 33 is a sectional view illustrating schematically one example of the wiring in an interposer. An interposer 1000 illustrated in FIG. 33 is provided with wiring 1021 for routing wires in the interposer, pads 1032 for connecting with connection terminals of a semiconductor element 50, and via conductors 1022 for providing electrical connection between the wiring 1021 and the pads 1032. Also included is a pad 1034 to which a wire 110 for supplying a supply voltage is connected, and a via conductor 1023 for connecting the pad 1034 to the wiring 1021.

Thus, the current for power supply flows to the wiring 1021 via the via conductor 1023. While the current for power supply flows through the wiring 1021, the voltage drops due to resistance of the wiring. Accordingly, the voltage to be supplied to the via conductor 1022, being the voltage to be applied to the semiconductor element 50, becomes lower than the voltage to be supplied to the pad 1034 through the wire.

Therefore, the longer the distance from the wire 110, the greater the effect due to the wiring resistance inside the interposer 1000 and the lower the supply voltage, which can result in a proper supply voltage not being applied to the semiconductor element.

Further, the wiring 1021 may be a fine wiring due to demand for a large number of wirings to be routed in a small area inside the interposer 1000. The smaller the cross sectional area is of such a finer wiring, the greater the resistance value per unit length, resulting in a tendency for the supply voltage to be applied to the semiconductor element being susceptible to voltage dropping. As a result, the voltage may falls below the voltage value necessary for a semiconductor element to normally operate, raising the possibility for the semiconductor element to not operate normally.

The present invention was undertaken in light of the problems described above, and to address the problem of the supply voltage drop to be applied to the semiconductor element connected via an interposer. An object of the invention is to provide an interposer wherein the supply voltage is not susceptible to dropping inside the interposer.

The exemplary aspects will now be described with reference to the accompanying drawings, wherein like reference numerals designate corresponding or identical elements throughout the various drawings.

In one exemplary aspect, for example, a conductor portion is formed inside a substrate, and the conductor portion and the first pad are electrically connected via a connection conductor. A first pad is formed on an outermost insulating layer such that a terminal of a semiconductor element can be connected to the first pad.

In such a case, a supply voltage supplied by a power supply circuit on a wiring substrate is applied to the semiconductor element via a conductor portion inside the substrate. Namely, a supply voltage can be applied to the semiconductor element without going through the fine wiring formed on the substrate. When a supply voltage can be applied to the semiconductor element without going through the fine wiring for routing inside the interposer, problems relating to drops in the supply voltage in the fine wiring do not occur, allowing a sufficient supply voltage to be applied to the semiconductor element.

In another aspect, the conductor portion is thicker than the wiring. This allows the voltage drop in the conductor portion to be more effectively controlled, resulting in a sufficient supply voltage being allied to the semiconductor element more easily.

In another aspect, the substrate of the interposer is composed of silicon. Since the degree of flatness of the substrate composed of silicon is extremely high, it allows a fine wiring to be formed on the surface thereof. Further, the warpage of the interposer due to the difference in thermal expansion coefficient between a semiconductor element to be mounted and the interposer can be controlled.

The connection conductor can include at least one first via conductor. In addition, the connection conductor can include a plurality of via conductors that are linearly laminated. In this example, the wiring distance from the conductor portion within the substrate can be shortened, allowing the voltage drop to be further effectively controlled.

The conductor portion can take the form of a power plane layer. A plane layer can result in lower the resistance encountered when the current for power supply flows through the conductor portion. In this example, the supply voltage in the wiring up to the semiconductor element is less susceptible to dropping.

The conductor portion can be a wiring for a power supply. This configuration allows the number of layers in terms of wiring layers to be reduced as it does not necessitate the mixed presence of both the wiring for signals and the wiring for power supply in terms of wiring layers on the substrate.

In one example, a first wiring is formed inside the insulating layer on the substrate and on the conductor portion or on the surface of the insulating layer. In this example, a second pad for signals is formed on the outermost insulating layer, and the second pad and the first wiring are electrically connected via the second via conductor.

In this example, since the first wiring formed in the interposer and the second pad for signals are connected via the second via conductor, a signal voltage can properly be applied to a semiconductor element via the second via conductor by following the fine first wiring for signals that are routed in the interposer.

The connection conductor can include at least one first via conductor that is larger in diameter than a second via conductor. Ordinarily, the larger the diameter of a via conductor, the lower the resistance of the via conductor. Thus, in this example, the resistance of the first via conductor having a larger diameter is lower than the second via conductor having a smaller diameter. The first via conductor can be a via conductor through which a supply voltage flows, and the second via conductor can be a via conductor through which a signal voltage flows. Due to the first via conductor having a larger diameter, and thereby a lower resistance value, the supply voltage drop in the wiring from the conductor portion up to the first pad can be effectively controlled, and the supply voltage drop in the interposer can be further controlled. Incidentally, with respect to a wiring for signals, since a smaller current flows through as compared to the wiring for power supply, a smaller diameter of the via conductor hardly lowers the signal quality. As a result, finer wiring for signals, including the second via conductor, can be utilized. For the purposes of the present disclosure, the diameter of the via conductor in the present specification shall indicate the diameter of the uppermost position (the top portion) of the via conductor.

In another aspect, a second wiring having a second pad are formed on the outermost insulating layer of the interposer. In this example, the second wiring and the first wiring are electrically connected via the second via conductor. A signal voltage is applied to the semiconductor element, following the wiring for signals that are routed with the use of the first wiring and that are further routed with the use of the second wiring. Namely, the routing of the wiring for signals becoming possible with the first wiring and the second wiring. In this example, if the wiring for a power supply including the first via conductor were to be formed in the region directly underneath the semiconductor element, it is possible to the route the wiring for signals so as to avoid the wiring for power supply.

As to the interposer as set forth in claim 12, the above-described connection conductor includes at least one first via conductor, and the above-described first via conductor is larger in diameter than the second via conductor. The relation of the diameter of the via conductor being set as such, the supply voltage drop in the wiring from the conductor portion up to the first pad through the first via conductor can effectively controlled.

In another exemplary aspect, the substrate is further provided with a though-hole electrode, and the through-hole electrode and the connection conductor are electrically connected via a conductor portion. The provision of a through electrode in the substrate allows the connection between the through-hole electrode and the wiring substrate via external connection terminals such as solder bumps. In such a case, the application of supply voltage to a semiconductor element over a short distance becomes possible, as compared to a case in which an interposer and a wiring substrate are connected via a wire. As a result, voltage drop can be controlled during the passage from the wiring substrate up to a semiconductor element, allowing a proper application of a supply voltage to the semiconductor element.

In another aspect, the insulating layer is formed on the substrate and the conductor portion and includes an inorganic insulating layer that includes an inorganic material and of an organic insulating layer formed on the above-described inorganic insulating layer and that includes an organic material.

In another aspect, the first wiring is formed in the inorganic insulating layer, and the surface of the above-described inorganic insulating layer and the surface of the above-described first wiring are disposed nearly on the same plane. The first wiring formed in the inorganic insulating layer with a semiconductor process employed could be a fine wiring suitable for the routing of the wiring for signals. The surface of the above-described inorganic insulating layer and the surface of the above-described first wiring being on nearly on the same plane allows the flatness of the organic insulating layer formed on the inorganic insulating layer to be secured, allowing the formation of the second wiring with a good precision. In addition, the second pad or the second wiring having the second pad can be formed on the surface of the above-described outermost organic insulating layer.

In another aspect, a method of manufacturing the interposer can include utilizing silicon for the substrate. Since a substrate composed of silicon has an extremely high degree of flatness, the use of silicon for the substrate allows the formation of fine wiring on the surface thereof.

A method of manufacturing an interposer can include forming the first wiring with a damascene method and forming the second wiring with a semi-additive method. The formation of the first wiring in an inorganic insulating layer with a damascene method allows the formation of the first wiring to be a fine wiring with a good precision. Further, it allows the formation of a wiring with a high degree of flatness. And, the formation of the second wiring with a semi-additive method on an organic insulating layer allows the formation of the second wiring at a low cost with a good precision.

Turning now to the Figures, FIG. 1 illustrates a first is a sectional view illustrating schematically an interposer in accordance with a first exemplary aspect of the present invention. As can be seen in FIG. 1, an interposer 1 is sandwiched between a semiconductor element 50 and a wiring substrate 100. The semiconductor element 50 and the interposer 1 are connected via bumps 42, for example. The interposer 1 and the wiring substrate 100 are connected via wires 110, 111. Various currents are supplied to the interposer via these wires 110, 111.

Figure 2:
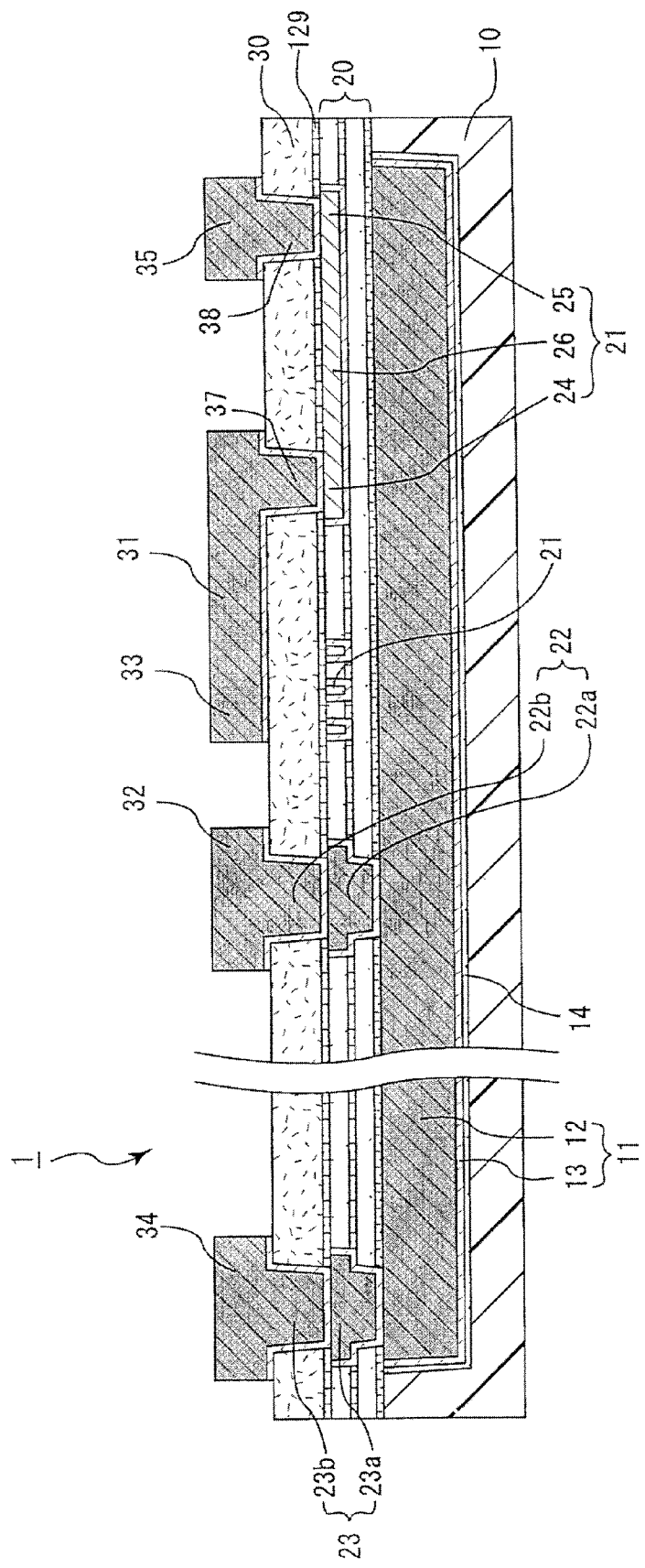
FIG. 2 is a sectional view illustrating schematically one example of a portion of an interposer in accordance with the first exemplary aspect.
Figure 3:
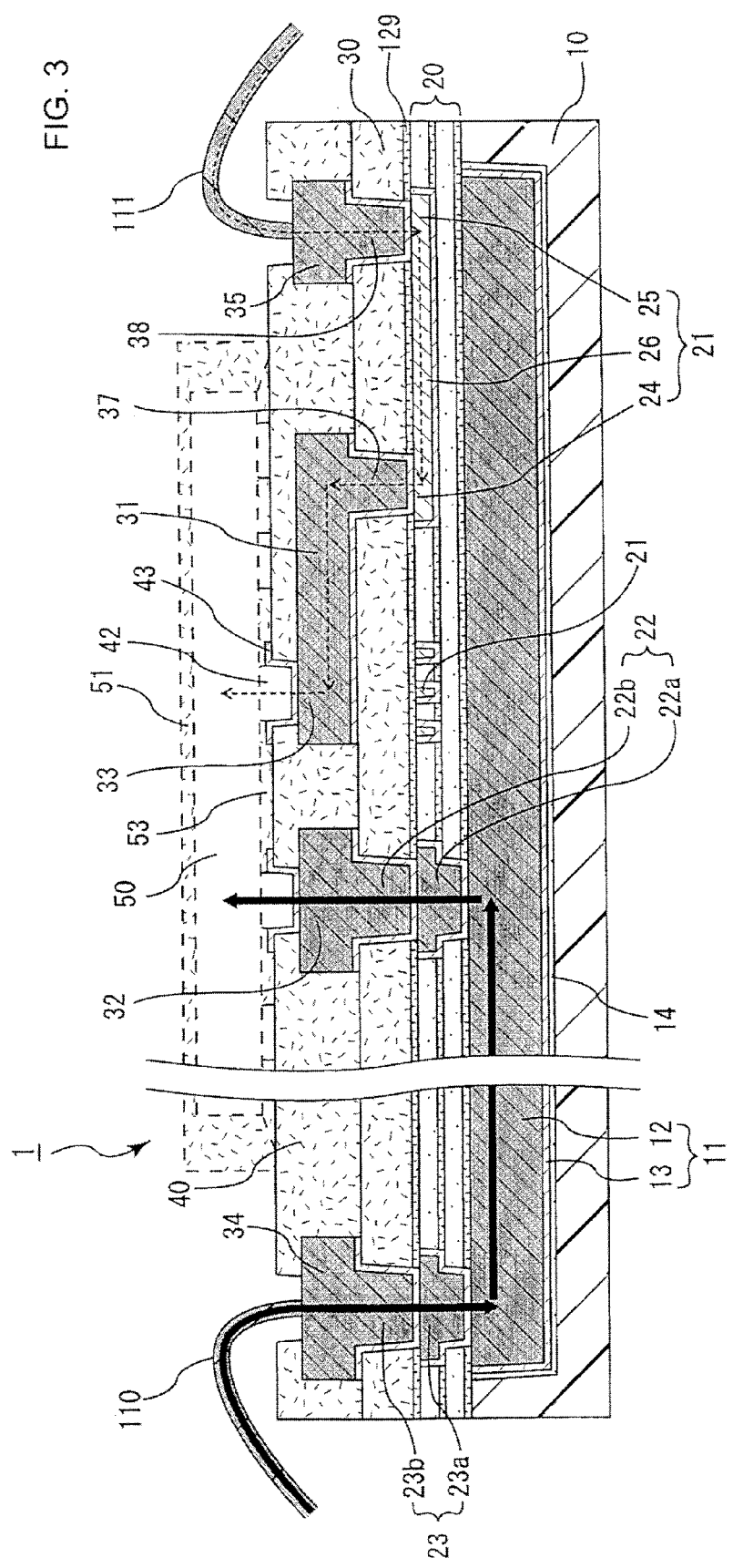
FIG. 3 is a sectional view illustrating schematically one example in which a protective film is provided on the interposer illustrated in FIG. 2, to which wires are connected, onto which a semiconductor element is loaded.

FIG. 2 is a sectional view illustrating schematically one example of a portion of an interposer in accordance with the first exemplary aspect. And, FIG. 3 is a sectional view illustrating schematically an exemplary aspect in which a protective film is provided on the interposer illustrated in FIG. 2. Wires 110 and 111 are connected to the interposer 1 in FIG. 3, and a semiconductor element 50 is mounted on the interposer 1. In addition, in FIG. 3, a current for power supply flows through the wire 110, and current for signals flows through the wire 111.

The interposer in accordance with the example illustrated in FIG. 2 includes a substrate 10 in which a conductor portion 11 is formed, an inorganic insulating layer 20 that includes an inorganic material, a first wiring 21 formed on the inorganic insulating layer 20, an organic insulating layer 30 that includes an organic material, a second wiring 31, and a first pad 32, a second pad 33, a third pad 34, and a fourth pad 35 formed on the surface of the organic insulating layer 30. The interposer 1 also includes several via conductors, which respectively provide an electrical connection between the conductor portion 11 and the pads 32 and 34, between the first wiring 21 and the pads 33 and 35, or between the first wiring 21 and the second wiring 31.

FIG. 3 illustrates a protective film 40 provided on the interposer 1, and a semiconductor element 50 mounted on the interposer 1. In addition, an inorganic thin film 129 is provided between the inorganic insulating layer 20 and the organic insulating layer 30. Further details of each of these elements will be sequentially described with reference to FIG. 2 and FIG. 3.

First, the substrate 10 will be described. The substrate can be formed of, for example, silicon, silicon nitride, silicon carbide, aluminum nitride, mullite, etc. Or, it may be a metal such as copper. Of these materials, it is preferable to use silicon, because the surface of silicon can have a high degree of flatness that allows a fine wiring to be formed. While the thickness of this substrate 10 is not particularly limited, it can be, for example, 30 to 800 μm. When the thickness of the substrate 10 is less than 30 μm, it is possible that the rigidity of the interposer cannot be secured. Conversely, when the thickness of the substrate 10 exceeds 800 μm, the thickness of the interposer as a whole ends up being increased, which can be undesirable.

The conductor portion 11 is formed inside the substrate 10. The conductor portion 11 is a conductor layer formed in a plane shape (hereinafter referred also to as a power plane layer), and includes a copper plating 12 and a conductor thin film 13 underneath the copper plating. The conductor portion 11 is formed such that it fills an indented portion 102 (refer to FIG. 4(b)) in a plane shape formed on the upper face of the substrate 10, and the thickness of the conductor portion can be, for example, 10 to 400 μm.

In the present example, in which silicon has been used as the substrate 10, an insulating film 14 is formed between the conductor portion 11 and the substrate 10. As for the material for the insulating film 14, it is not particularly limited so long as it has an insulating property. The insulating layer 14 can be, for example, a layer that includes an inorganic material such as $SiO_2$ (silicon dioxide).

The inorganic insulating layer 20 and the wiring inside the inorganic insulating layer are described next. The inorganic insulating layer 20 in accordance with the first exemplary aspect is a layer that includes an inorganic material such as $SiO_2$ and $Si_3N_4$ (silicon nitride). One example of the specific layer constitution will be described in greater detail below when a method of manufacturing an interposer in accordance with the present example is described.

A first via conductor 22a, part of a connection conductor 22, is formed in the inorganic insulating layer 20. The first via conductor 22a connects the conductor portion 11 and the first pad 32. The lower face of the first via conductor 22a is connected to the conductor portion 11.

Further, a third via conductor 23a, part of a connection conductor 23, is formed in the inorganic insulating layer 10. The third via conductor 23a connects the third via conductor 34 (which will be described later) and the conductor portion 11. The lower face of the third via conductor 23a is connected to the conductor portion 11. Thus, as can be seen in FIG. 2, the first via conductor 22a and the third via conductor 23a are electrically connected via the conductor portion 11.

The first via conductor 22a and the third via conductor 23a include a copper plating and a seed layer underneath the copper plating. One example of the constitution of the seed layer will be described below in conjunction with an explanation of an example method of manufacturing an interposer in accordance with the present exemplary aspect.

The first wiring 21 is formed inside the inorganic insulating layer 20, such that the surface of the first wiring 21 and the surface of the inorganic insulating layer 20 are disposed nearly on the same plane. The first wiring 21 includes a copper plating and a seed layer underneath the copper plating. One example of the constitution of the seed layer will be described below in conjunction with an explanation of an example method of manufacturing an interposer in accordance with the present exemplary aspect. The first wiring 21 includes lands 24, 25, and a wiring portion 26 that provides a connection between the lands 24, 25.

In the present example, the first via conductor 22a, the third via conductor 23a, and the first wiring 21 are formed with a damascene method. Accordingly, the surfaces made up of the inorganic insulating layer 20, the first via conductor 22a, the third via conductor 23a, and the first wiring 21 can be disposed nearly on the same plane. In addition, since the first wiring 21 is formed with a damascene method, the wiring portion 26 results in a fine wiring (L/S=0.5/0.5 to 10/10 μm).

The organic insulating layer 30 and the wiring inside the organic insulating layer and on the organic insulating layer will now be described. The organic insulating layer 30 in accordance with the first exemplary aspect includes an organic material, and is formed on the inorganic insulating layer 20 and on the first wiring 21. This organic insulating layer 30 includes openings 36 (refer to FIG. 9(b)), and a first via conductor 22b, a second via conductor 37, a third via conductor 23b, and a fourth via conductor 38 are formed in the openings 36.

The first via conductor 22b is formed directly above the first via conductor 22a, such that the first via conductor 22b and the first via conductor 22a form the connection conductor 22. The third via conductor 23b is also formed directly above the third via conductor 23a, such that the first via conductor 23a and the first via conductor 23b form the connection conductor 23. The lower face of the second via conductor 37 is connected to a land 24 of the first wiring 21, and the lower face of the fourth via conductor 38 is connected to a land 25 of the first wiring 21. Thus, the second via conductor 37 and the fourth via conductor 38 are electrically connected via the first wiring 21.

The first pad 32, the second pad 33, the third pad 34, and the fourth pad 35 are loaded onto the organic insulating layer 30. The second wiring 31 is further formed on the organic insulating layer 30, and the second pad 33 and the second via conductor 37 are electrically connected via the second wiring 31. This second wiring 31 can be, for example, 3 to 10 μm in thickness.

The first pad 32 is a power supply pad and is connected to the connection terminal for power supply on a semiconductor element 50. Since the lower face of the first pad 32 is connected to the first via conductor 22, the first pad 32 and the conductor portion 11 are electrically connected via the first via conductors 22a, 22b (the connection conductor 22). The wire 110 is connected to the third pad 34. The third pad 34 and the conductor portion 11 are electrically connected via the third via conductors 23a, 23b (the connection conductor 23). Therefore, the first pad 32 and the third pad 34 are electrically connected from the side of the third pad 34 through the third pad 34, the third via conductors 23a, 23b, the conductor portion 11, the first via conductors 22a, 22b, and the first pad 32.

When the wire 110 is connected to the third pad 34 and a supply voltage is supplied to the third pad 34, the supply voltage is transmitted up to the first pad 32 by the path illustrated schematically in FIG. 3 with an arrow with a solid line. In the first exemplary aspect, since the conductor portion 11 is a power plane layer formed in a plane shape, the transmission of a current when flowing inside the conductor portion 11 is undertaken with the shortest path between the lower face of the third via conductor 23a and the lower face of the first via conductor 22a. In addition, the conductor portion 11 is, for example, 10 to 400 µm in thickness. Thus, the conductor portion 11 is not a wiring having a high resistance such as a fine wiring but a conductor having a low resistance. Accordingly, a supply voltage supplied to the third pad 34 via the wire 110 is prevented from dropping inside the interposer 1, resulting in a proper supply voltage being supplied to the first pad 32.

The second pad 33 is a pad for signals, and is connected to the connection terminal for signals on the semiconductor element 50. The wire 111 is connected to the fourth pad 35. The fourth pad 35 is connected to the first wiring 21 via the fourth via conductor 38. A pad for grounding (not illustrated) is formed on the organic insulating layer 30 there is formed.

Therefore, the second pad 33 and the fourth pad 35 are electrically connected from the side of the fourth pad 35 through the fourth pad 35, the fourth via conductor 38, the first wiring 21 (including a land 25, a wiring portion 26, and a land 24), the second via conductor 37, the second wiring 31, and the second pad 33. When the wire 111 is connected to the fourth pad 35 and a signal voltage is supplied to the fourth pad 35, the signal voltage is transmitted up to the second pad 33 by the path illustrated schematically in FIG. 3 with an arrow with a dotted line.

As described above, for the portions of wiring through which a current for signals flows, a fine wiring is routed with the use of the first wiring 21. For the wiring portions which does not require routing with a fine wiring, the wiring is undertaken with the use of the second wiring 31 having a larger cross-sectional area than the first wiring 21.

The organic insulating layer 30 is, for example, a layer that includes a thermosetting resin, a photosensitive resin, a resin to which a photosensitive group is added to a portion of a thermosetting resin, a thermoplastic resin, or a resin complex containing these resins, etc. Specifically, it can be, for example, composed of a photosensitive polyimide resin.

The first via conductor 22b, the third via conductor 23b, the second via conductor 37, the fourth via conductor 38, and the second wiring 31 are composed of a copper plating and a seed layer underneath the copper plating. One example of the constitution of the seed layer will be described below in conjunction with an explanation of an example method of manufacturing an interposer in accordance with the present exemplary aspect.

In the present example, the first via conductor 22b, the third via conductor 23b, the second via conductor 37, the fourth via conductor 38, and the second wiring 31 are formed with a semi-additive method. The first via conductors 22a, 22b are such that they are larger in diameter than the second via conductors 37. The first via conductors 22a, 22b are, for example, 2 to 30 µm in diameter, and the second via conductors 37 are, for example, 0.5 to 10 µm in diameter.

Next, a protective film 40 and a semiconductor element 50 will be described. The protective film 40 is formed on the organic insulating layer 30 and on the second wiring 31. The protective film 40 has openings 41 (refer to FIG. 11(a)) that partially exposing each of the pads. Namely, as illustrated in FIG. 3, the outer peripheral area of each pad is covered with a protective film 40. While the material for the protective film 40 is not particularly limited, it can be, for example, an organic material from the standpoint of the adhesion to the organic insulating layer 30.

In the openings 41, which expose the first pad 32 and the second pad 33, a bump 42 is formed of solder via a barrier metal layer 43. The semiconductor element 50 is connected to the interposer via this bump 42. An underfill resin 53 is filled between the semiconductor element 50 and the interposer. Further, the semiconductor element 50 is sealed with a seal resin 51.

Next, a method of manufacturing an interposer in accordance with the first exemplary aspect will be described with reference to the drawings. FIGS. 4(a)-(c) and 5(a)-(c) are sectional views illustrating schematically a portion of the manufacturing process of an interposer in accordance with the first exemplary aspect. A step of forming a conductor portion in a substrate will next be described.

Figure 4:
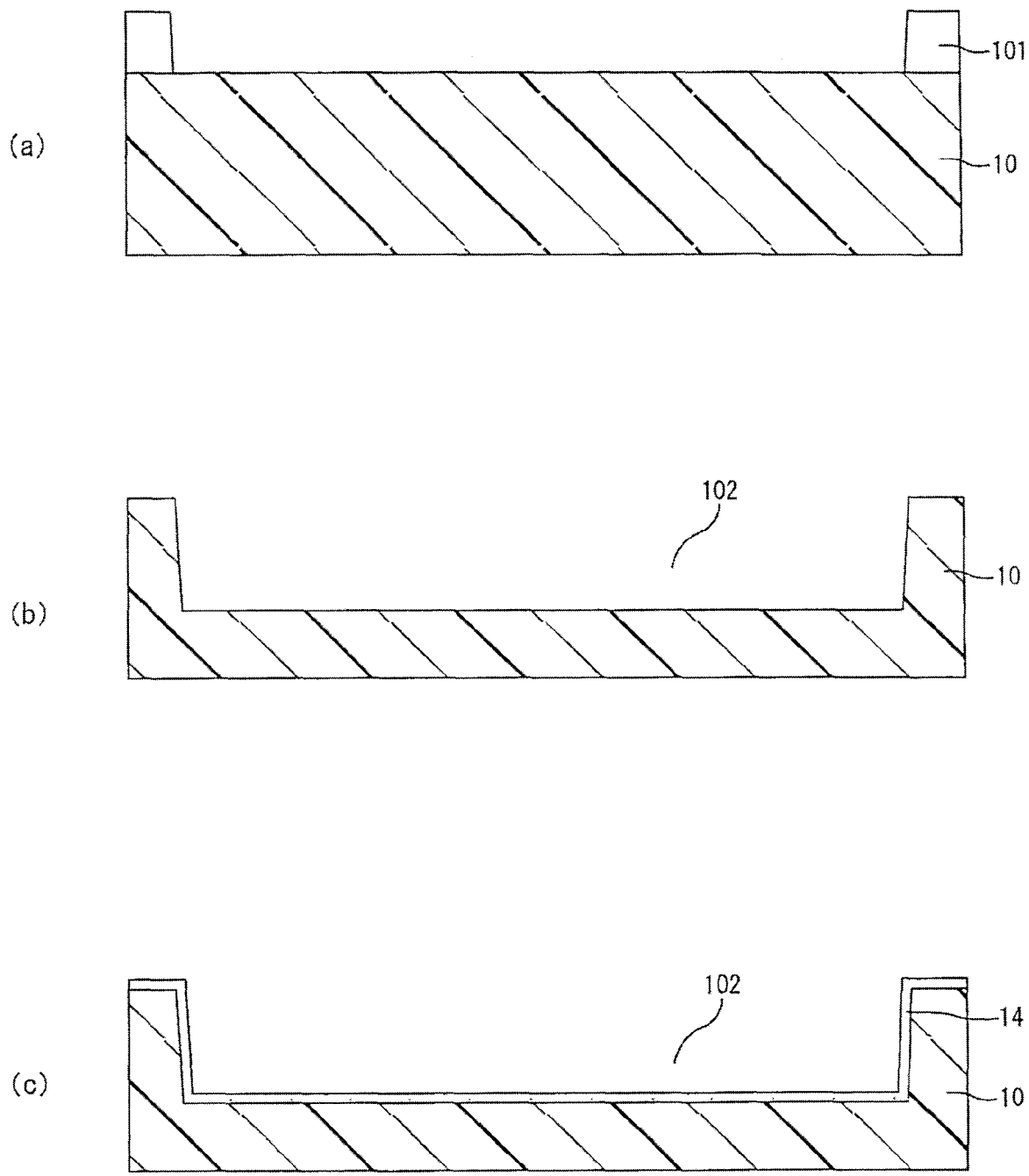
FIGS. 4(a)-(c) are sectional views illustrating schematically a portion of the manufacturing process of an interposer in accordance with the first exemplary aspect.

First, as illustrated in FIG. 4(a), a resist is coated onto a substrate 10. The substrate 10 can be a silicon wafer, which is exposed and developed via a mask to form a resist pattern 101. In addition, each of the resist patterns illustrated in the present specification can be formed with the above-described method. However, the present invention is not limited solely to this aspect, and a dry film, in lieu of a resist coating, may be used.

As illustrated in FIG. 4(b), the site of the substrate 10 on which the resist pattern has not been formed is etched with dry etching (a reactive ion etching) such that an indented portion 102 is formed. The method of forming this indented portion 102 is not limited to dry etching, and wet etching may be employed with the use of a predetermined etchant.

Further, as illustrated in FIG. 4(c), an insulating film 14 that includes $SiO_2$ is formed with, for example, CVD (Chemical Vapor Deposition).

Next, as illustrated in FIG. 5(a), a conductor thin film 13 that includes Ni/Cu is formed on the surface of the insulating film 14 by, for example, sputtering. However, the constitution of the conductor thin film 13 is not limited to Ni/Cu, and the method of forming the conductor thin film 13 is not limited to sputtering. For example, as will be readily apparent to those of ordinary skill in the art, electroless plating may be employed.

Next, as illustrated in FIG. 5(b), the thin conductor film 13 is subjected to electrolytic copper plating with the conductor thin film 13 acting as a power supply layer to form an electrolytic copper plating layer 12. It will suffice to undertake electrolytic copper plating in accordance with a method conventionally known to the public.

Next, as illustrated in FIG. 5(c), the element is subjected to planarization as it goes through CMP (Chemical Mechanical Polishing) such that the removal of the conductor thin film 13 and the insulating film 14 exposes the substrate 10 at the portions of the substrate 10 other than the indented portion 102. With the above steps, a conductor portion 11 (a power plane layer) is formed inside the substrate 10 and at the site where the indented portion 102 has been formed.

The steps following the formation of the conductor portion will next be described with the use of drawings illustrating the region indicated by an double-directional arrow R in FIG. 5(c). Namely, only a region in which the conductor portion 11 is provided will be illustrated.

FIGS. 6(a)-(d), FIGS. 7(a)-(d), and FIGS. 7(a)-(c) are sectional views illustrating schematically a portion of the manufacturing process of an interposer in accordance with the first exemplary aspect. A step of forming an inorganic insulating layer and a wiring inside the inorganic insulating layer will be described next.

Figure 6:
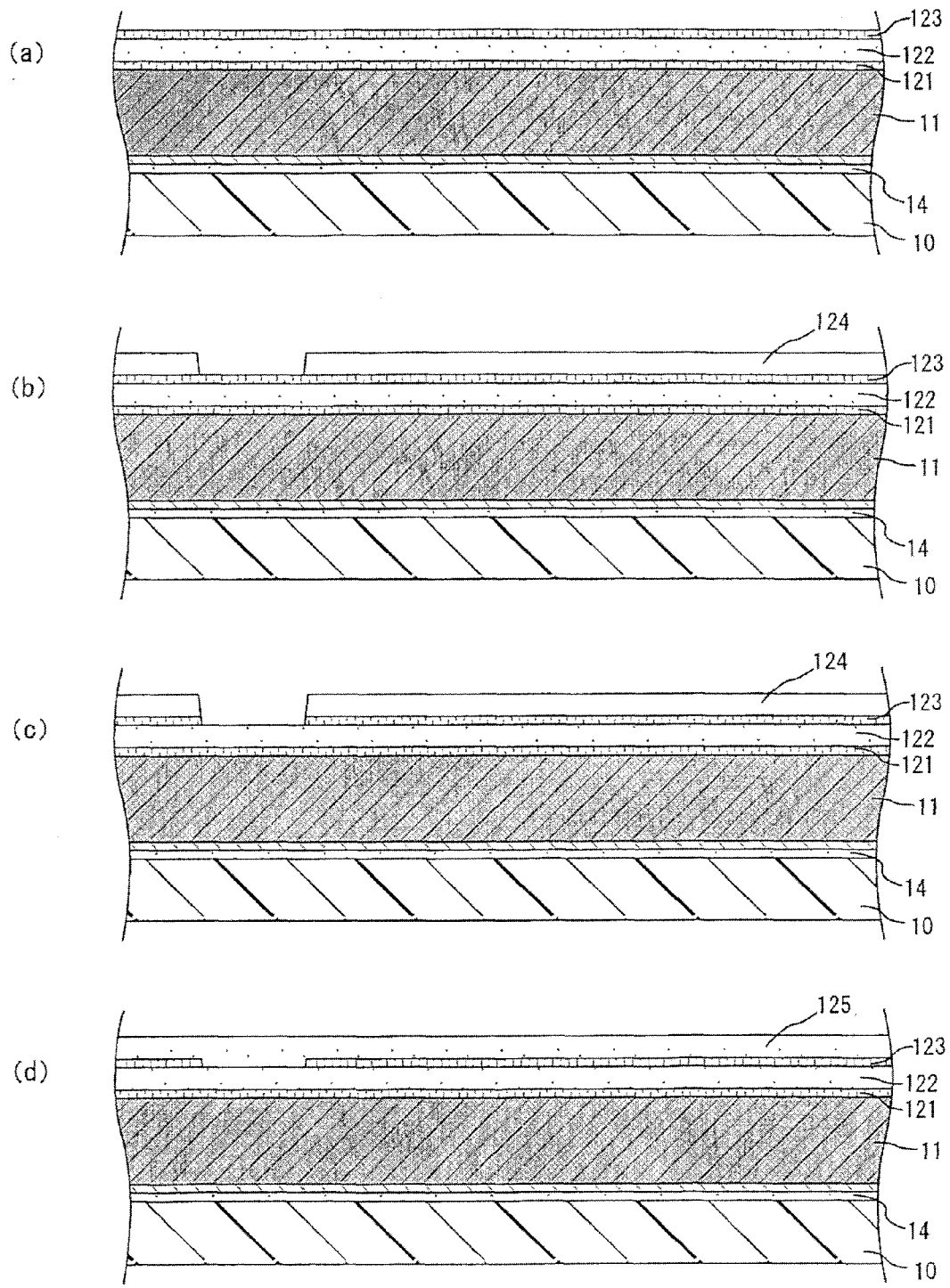
FIGS. 6(a)-(d) are sectional views illustrating schematically a portion of the manufacturing process of an interposer in accordance with the first exemplary aspect.

First, as illustrated in FIG. 6(a), inorganic insulating layers (for example, the first $Si_3N_4$ layer 121, the first $SiO_2$ layer 122, and the second $Si_3N_4$ layer 123) are formed on the substrate 10 and on the conductor portion 11 with, for example, CVD.

Next, as illustrated in FIG. 6(b), a resist pattern 124 is formed on the second $Si_3N_4$ layer 123. Next, it is subjected to dry etching (reactive ion etching) to etch the second $Si_3N_4$ layer 123 on the portion where the resist pattern 124 has not been formed. This forms a pattern as illustrated in FIG. 6(c) on the second $Si_3N_4$ layer 123.

Next, as illustrated in FIG. 6(d), the second $SiO_2$ layer 125 is formed with CVD while the resist pattern 124 is removed. Next, a resist pattern 126 is formed on the second $SiO_2$ layer 125.

Figure 7:
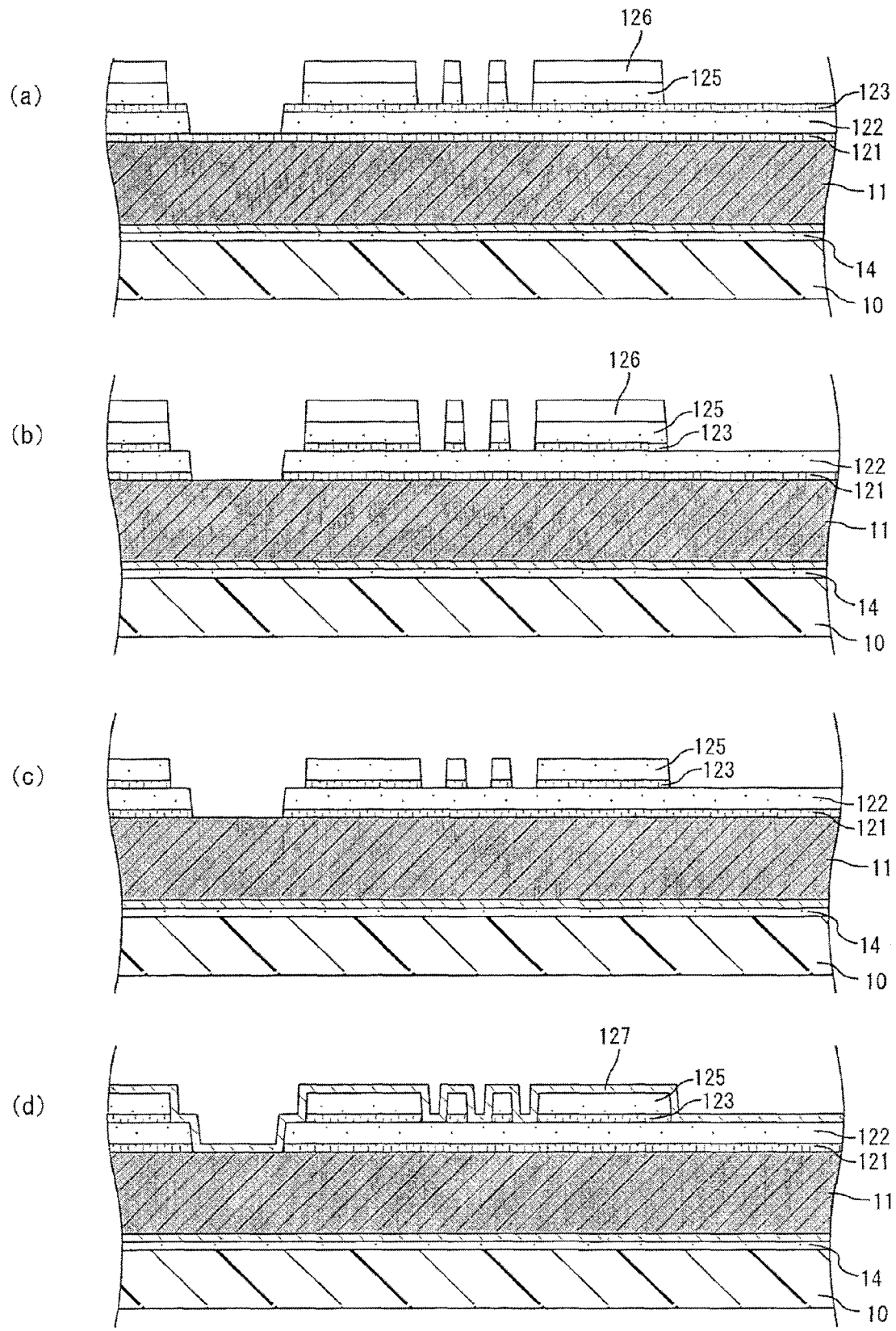
FIGS. 7(a)-(d) are sectional views illustrating schematically a portion of the manufacturing process of an interposer in accordance with the first exemplary aspect.
Figure 8:
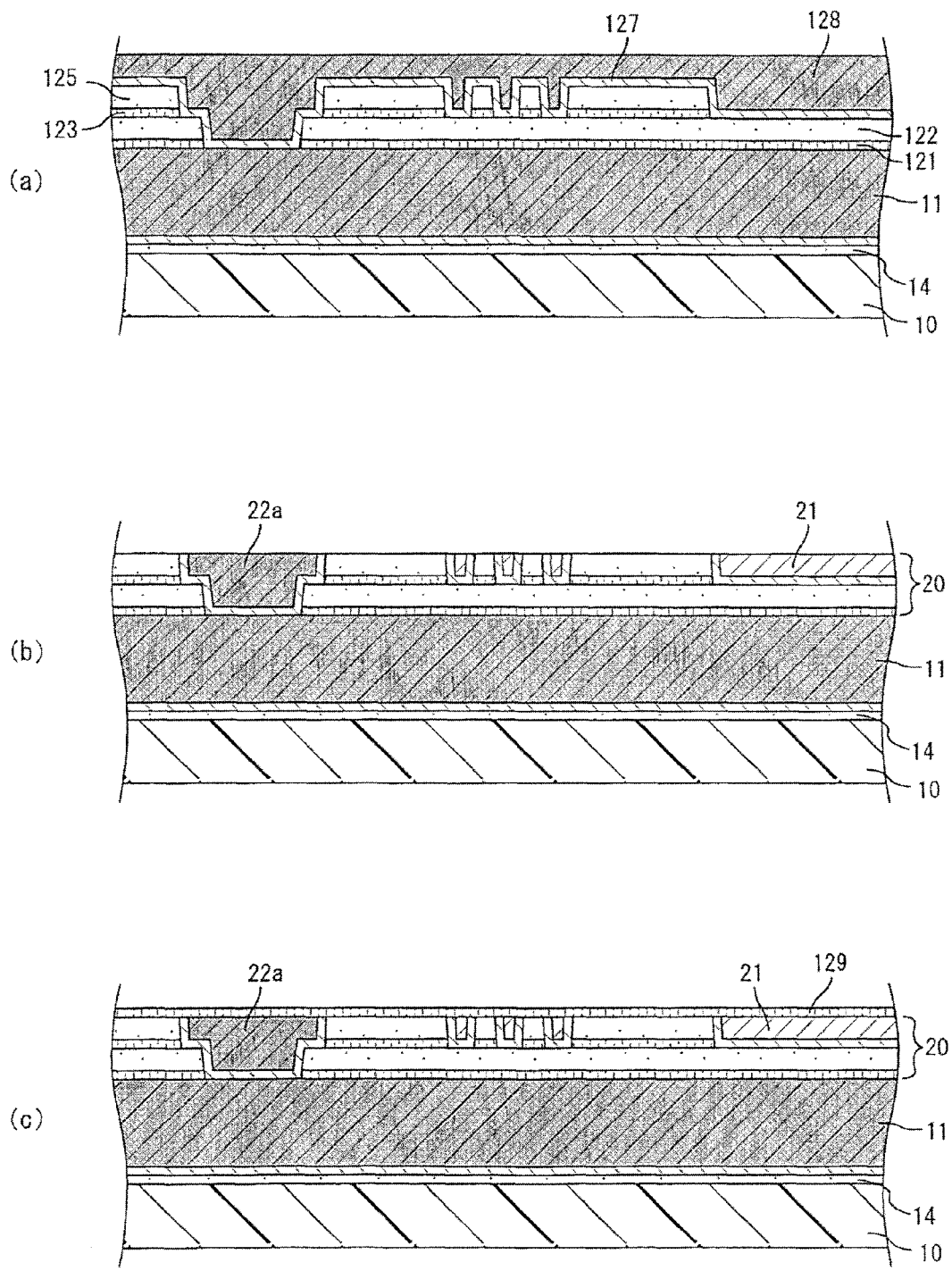

Further, as illustrated in FIG. 7(a), the substrate is subjected to dry etching (reactive ion etching) to etch the second $SiO_2$ layer 125 on the portion where the resist pattern 126 has not been formed; and the first $SiO_2$ layer 122 is etched at the site where it is exposed on account of the second $Si_3N_4$ layer 123.

Next, as illustrated in FIG. 7(b), the substrate is further subjected to dry etching (reactive ion etching) with a different type of gas to remove the second $Si_3N_4$ layer 123 and the first $Si_3N_4$ layer 121 exposed on the surface. Thus, the conductor portion 11 is exposed at the site where the first $Si_3N_4$ layer 121 has been removed. Further, as illustrated in FIG. 7(c), the resist pattern 126 is removed.

Next, as illustrated in FIG. 7(d), a seed layer 127 is formed by, for example, sputtering, on the surfaces of the conductor layer 11, the first $SiO_2$ layer 122, and the second $SiO_2$ layer 125. The constitution of the seed layer 127 in the present example is formed with sputtered films of TaN, Ta, and Cu sequentially from the bottom, but the present invention is not limited to this specific method or constitution.

Next, as illustrated in FIG. 7(a), the substrate is subjected to electrolytic copper plating with the seed layer 127 as a power supply layer to form an electrolytic copper plating layer 128. It will suffice to undertake electrolytic copper plating with a conventional method known to the public.

Next, as illustrated in FIG. 7(b), the substrate is subjected to CMP to remove the electrolytic copper plating layer 128 and the seed layer 127 on the surface of the second $SiO_2$ layer 125. In addition, it will suffice to undertake CMP with the use of a method and apparatus known in conjunction with a conventional damascene method. The layer that includes the first $Si_3N_4$ layer 121, the first $SiO_2$ layer 122, the second $Si_3N_4$ layer 123, and the second $SiO_2$ layer 125 formed up to this step will constitute an inorganic insulating layer 20. Following CMP, the remaining seed layer 127 and the electrolytic copper plating layer 128 constitute the first wiring 21 and the first via conductor 22a. In addition, the third via conductor 23a, though not illustrated, is formed likewise as with the first via conductor 22a.

With the steps as in the above, the inorganic insulating layer as well as the first wiring and the first via conductor 22a (the third via conductor 23a) can be formed. An inorganic thin film 129 such as $Si_3N_4$ is formed with, for example, CVD, etc., (refer to FIG. 7(c)) on the surfaces of the inorganic insulating layer 20 and the first wiring 21. This inorganic thin film 129 is provided for the purpose of enhancing the adhesion between the organic insulating layer and the inorganic insulating layer.

A step of forming an organic insulating layer as well as a wiring inside the organic insulating layer and on the organic insulating layer will be described next. FIGS. 9(a)-(d) and FIGS. 10(a)-(d) are sectional views illustrating schematically a portion of the manufacturing process of an interposer in accordance with the first exemplary aspect.

Figure 9:
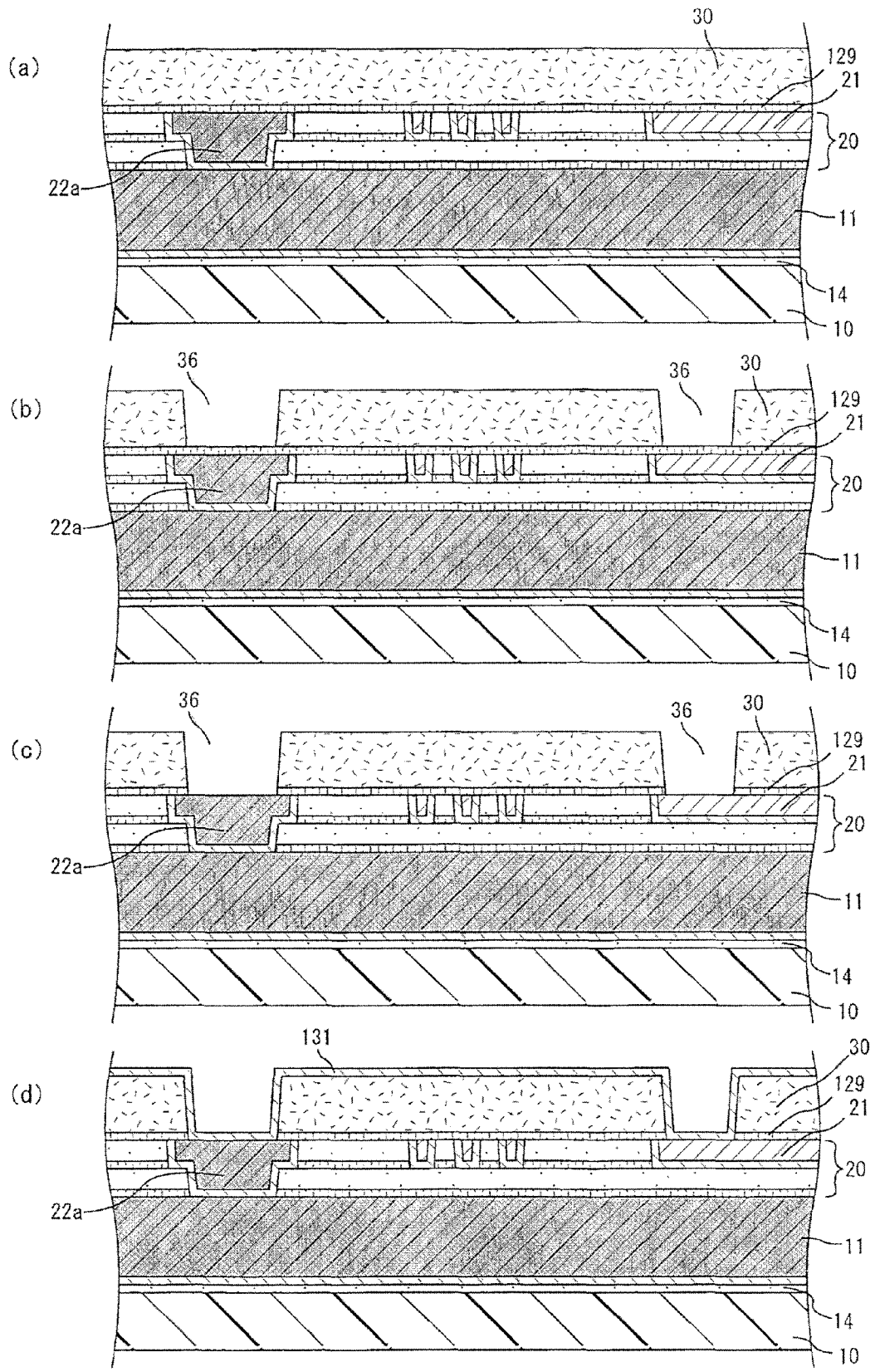
FIGS. 9(a)-(d) are sectional views illustrating schematically a portion of the manufacturing process of an interposer in accordance with the first exemplary aspect.

First, as illustrated in FIG. 9(a), an organic insulating layer 30 is formed on an inorganic insulating layer 129 (on the inorganic insulating layer 20 as well as the first wiring 21 and the first via conductor 22a), and openings 36 are formed as illustrated in FIG. 9(b). A method such as a pre-hardened photosensitive polyimide resin, for example, being coated with the use of a roll coater, for example, can be used to form the organic insulating layer 30. An exposure and development treatment, for example may be used as a method for forming the openings. Next, as illustrated in FIG. 9(c), the inorganic thin film 129 exposed by the openings 36 is removed with dry etching (reactive ion etching, for example).

Next, as illustrated in FIG. 9(d), a seed layer 131 is formed on the surface (including the side wall of the openings 36) of the organic insulating layer 30 and on the upper faces of the first wiring 21 and portions of the first via conductor 22a that are exposed by the openings 36. The seed layer 131 can be formed by sputtering, for example, and can be composed of Ti and Cu in the present exemplary aspect. However, the structure of and a method of manufacturing the seed layer 131 is not limited to these examples.

Figure 10:
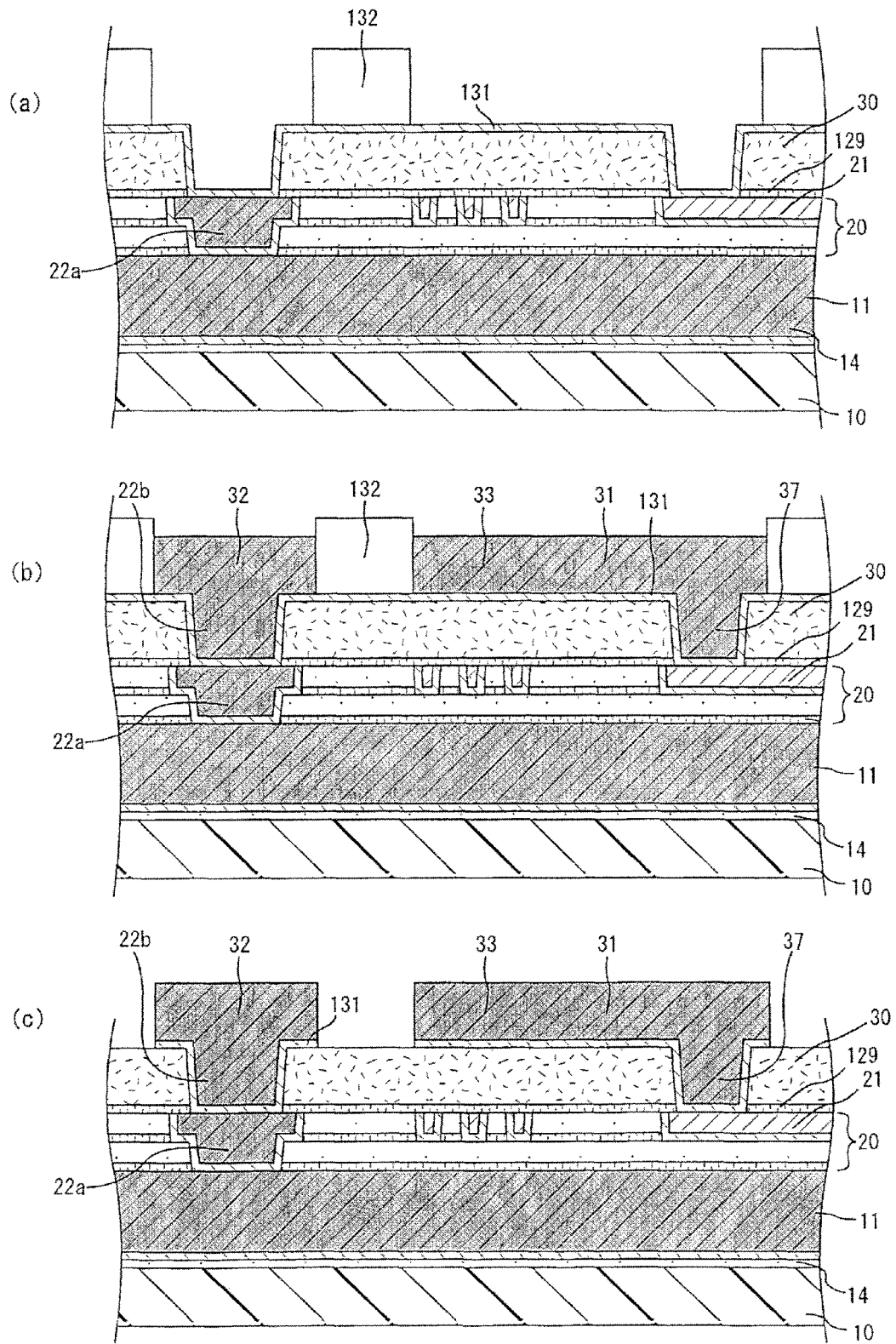
FIGS. 10(a)-(c) are sectional views illustrating schematically a portion of the manufacturing process of an interposer in accordance with the first exemplary aspect.

Next, as illustrated in FIG. 10(a), a plating resist layer is formed by exposure and developed via a mask, and the plating resist pattern 132 is formed by the plating resist at the locations where each pad and the second wiring are to be formed. As for a plating resist, a photosensitive dry film, etc., for example, may be used. In addition, for example, the formation of the plating resist pattern can be done with the same method.

Continuing on, as illustrated in FIG. 10(b), the substrate is subjected to electrolytic copper plating with the seed layer 131 as a power supply layer providing copper plating at the site where a plating resist pattern 132 has not been formed. This plating action integrally forms the first via conductor 22b and the first pad 32 on the first via conductor 22a. Further, the second via conductor 37 is formed on the first wiring 21 and the second wiring 31 and the second pad 33 are integrally formed with the second via conductor 37. In addition, though not illustrated, the third via conductor 23b is formed on the third via conductor 23a, and the third pad and the third via conductor 23b are integrally formed. The fourth via conductor is formed on the first wiring, and the fourth pad and the fourth via conductor are integrally formed.

Next, as illustrated in FIG. 10(c), the remaining plating resist is removed and at the same time the seed layer 131 underneath the plating resist pattern removed is removed by etching. While the etching method of this seed layer 131 is not particularly limited, dry etching (reactive ion etching) is preferable from the standpoint of controlling the overetching of the electrolytic copper-plating. With the steps above, an organic insulating layer and a wiring inside the organic insulating layer and on the organic insulating layer can be formed.

Figure 11:
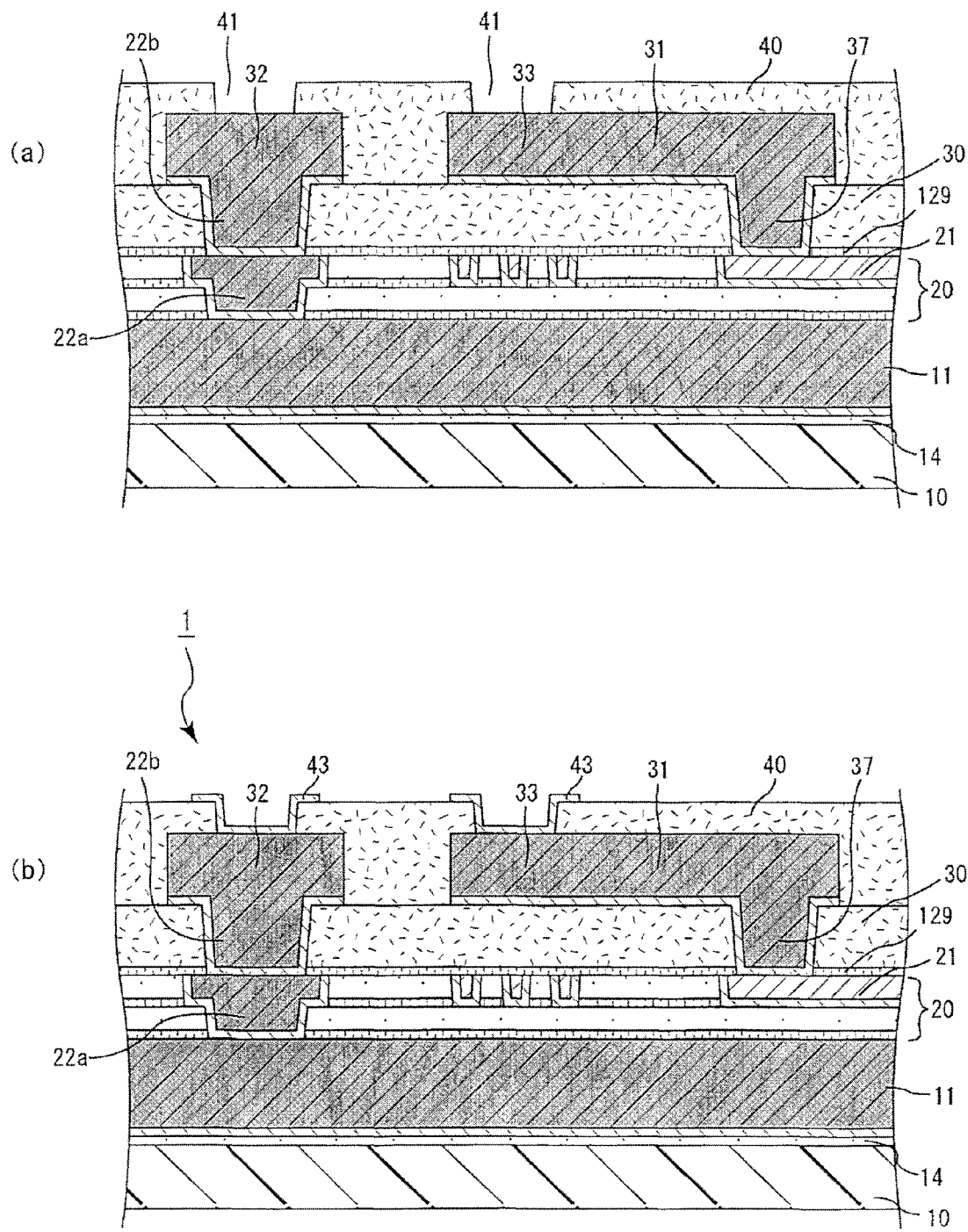
FIGS. 11(a) and (b) are sectional views illustrating schematically a portion of the manufacturing process of an interposer in accordance with the first exemplary aspect.

Next, a step of forming a protective film will be described. FIG. 11(a) and FIG. 11(b) are sectional views illustrating schematically a portion of the manufacturing process of an interposer in accordance with the first exemplary aspect. First, as illustrated in FIG. 11(a), an organic insulating layer 40 is formed on the organic insulating layer 30. Openings 41 are formed in the newly formed organic insulating layer 40. This newly formed organic insulating layer 40 constitutes a protective film. As to the organic insulating layer 40 as a protective film, a material the same as the organic insulating layer 30 can be used. Moreover, a method of forming the openings 41 can be the same as the method used for forming the openings 36 in the organic insulating layer 30.

Next, as illustrated in FIG. 11(b), a barrier metal layer 43 is formed in the openings 41 provided in the organic insulating layer 40. This barrier metal layer 43 is formed by sputtering tantalum nitride and tantalum, for example, sequentially. However, the material constituting and a method of manufacturing this barrier metal layer 43 are not particularly limited. In addition, though not depicted in the Figures, Ni/Au or Ni/Pd/Au is plated on the portions of the surface of the barrier metal layer that are exposed by the opening in the protective film. This is to secure adhesion between the solder and the pad when solder joining, described below, is performed.

The above steps describe an example method for manufacturing the interposer 1 in accordance with the first exemplary aspect. In addition, it will suffice to perform the formation of a protective film and the formation of a barrier metal layer as necessary.

Next, a step of loading a semiconductor element onto the interposer in accordance with the present example will be described. FIG. 12(a) and FIG. 12(b) are sectional views illustrating schematically an example of mounting an interposer in accordance with the first example. First, as illustrated in FIG. 12(a), bumps 42 composed of solder are formed on the barrier metal layer 43. Next, as can be seen in FIG. 12(b), the bumps 42 are connected to an electrode of a semiconductor element 50 (not illustrated) by flip-chip mounting. An underfill resin 53 is filled and hardened between the semiconductor element 50 and the interposer 1. Next, the semiconductor element 50 is sealed in by sealing all around the semiconductor element 50 with a seal resin 51. Resins such as those that are known to the public can be used for the underfill resin and the seal resin.

When a silicon wafer is used for a substrate and the above-described wiring is formed on the silicon wafer, the use of a silicon wafer sufficiently large with respect to the dimensions of each of the interposers allows the formation of a plurality of interposers out of one sheet of silicon wafer. In this case, after the above-described wiring has been formed on a silicon wafer, it is made into individual pieces by each interposer by it being cut into a predetermined size with a dicer, etc., for example.

Next, the operations and effects of an interposer and of a method of manufacturing an interposer in accordance with the present example will be listed.

(1) In the present example, a wire through which a current for power supply flows is connected to the third pad of the example interposer, and a supply voltage is supplied to the conductor portion via the third via conductor. The supply voltage can be supplied to the first pad for power supply from the conductor portion via the first via conductor. Therefore, the supply voltage can be supplied to the first pad without going through the wiring for routing formed inside the interposer. Accordingly, the supply voltage drop inside the interposer can be prevented, allowing sufficient supply voltage to be applied to a semiconductor element connected to the first pad.

(2) The interposer in accordance with the present exemplary aspect can include a substrate composed of silicon. Including a substrate adds rigidity to the interposer, allowing, for example, the warpage of the interposer due to thermal expansion to be reduced. Further, since a substrate composed of silicon has an extremely high degree of flatness, the formation of fine wiring on the surface thereof becomes possible. In addition, the warpage of the interposer due to the difference in thermal expansion coefficient between a plurality of semiconductor elements and the interposer can further be controlled.

(3) Since the conductor portion of the present example is a power plane layer, the resistance encountered when the current for power supply flows through the conductor portion is less. This configuration allows the example interposer to be less susceptible to a supply voltage drop in the wiring leading up to the semiconductor element.

(4) Since the first wiring and the second pad for signals formed inside the interposer are connected via the second via conductor, a signal voltage can be applied to the semiconductor element via the second via conductor by following the fine first wiring for signals routed inside the interposer.

(5) In the present example, the first via conductor is larger in diameter than the second via conductor. By the first via conductor being larger in diameter and the first via conductor being low in resistance value, the supply voltage drop in the wiring from the conductor portion reaching up to the first pad can be effectively controlled, allowing the supply voltage drop inside the interposer to be further controlled.

(6) Because the second wiring that includes the second pad is provided in the example interposer, the first wiring and the second wiring are electrically connected via the second via conductor. Accordingly, a signal voltage can be applied to the semiconductor element by the wiring for signals being further routed with the use of the second wiring. Namely, the wiring for signals becomes possible with the first wiring and the second wiring.

(7) In the present example, the first wiring is formed inside the inorganic insulating layer, and the surface of the inorganic insulating layer and the surface of the first wiring are disposed nearly on the same plane. The first wiring formed inside the inorganic insulating layer with the employment of a semiconductor process can be a fine wiring suitable for the routing of a wiring for signals. When the surface of the inorganic insulating layer and the surface of the first wiring are disposed nearly on the same plane, the flatness of an organic insulating layer to be formed on the inorganic insulating layer can be secured, allowing the formation of the second wiring with a good precision.

(8) When it comes to a method of manufacturing an interposer in accordance with the present example, it allows the manufacture of an interposer having a structure in which a supply voltage is supplied from the conductor portion to the first pad via a connection conductor and in which the supply voltage is not susceptible to drop inside the interposer.

(9) And, when it comes to a method of manufacturing an interposer in accordance with the present example, the first wiring is formed inside the inorganic insulating layer with a damascene method, and the second wiring is formed on the organic insulating layer with a semi-additive method. Accordingly, the example method allows the first wiring to be a fine wiring with a good precision. Further, it allows a wiring with a high degree of flatness to be formed. Moreover, it allows the second wiring to be formed at a low cost and with a good precision.

Figure 13:
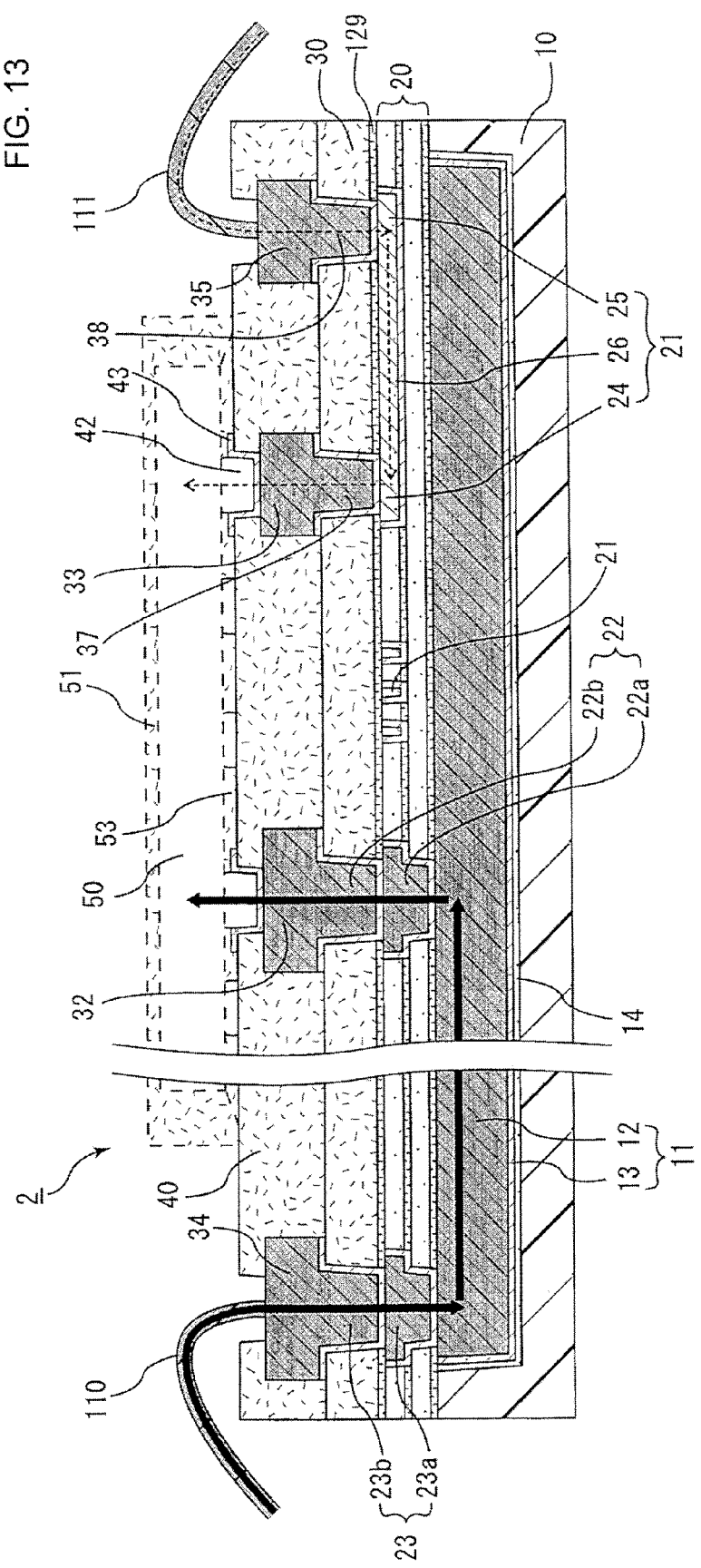
FIG. 13 is a sectional view illustrating schematically one example of a portion of an interposer in accordance with the second exemplary aspect.

An interposer in accordance with a second exemplary aspect differs from the first exemplary aspect in that it does not have the second wiring and in that the second pad and the first wiring are electrically connected via the second via conductor only. FIG. 13 is a sectional view illustrating schematically one example of a portion of an interposer in accordance with the second exemplary aspect. In the interposer illustrated in FIG. 13, the second via conductor 37 and the second pad 33 are integrated and the second wiring is not formed.

In this example, the second pad 33 and the fourth pad 35 are electrically connected from the fourth pad 35 side through the fourth pad 35, the fourth via conductor 38, the first wiring 21 (including a land 25, a wiring portion 26, and a land 24), the second via conductor 37, and the second pad 33. When a wire 111 is connected to the fourth pad 35 and a signal voltage is supplied, the signal voltage is transmitted to the second pad 33 by a path schematically illustrated in FIG. 13 with an arrow with a dotted line.

Since the interposer in accordance with the second exemplary aspect can be manufactured such that the second via conductor and the second pad are integrally formed without the formation of the second wiring as described above with reference to the first exemplary aspect, a detailed description of the method of manufacture will be omitted. The present example can exhibit the effects of (1) through (5) as well as (7) and (8) described under the first exemplary aspect.

The interposer in accordance with a third exemplary aspect differs from the first exemplary aspect in that the conductor portion is not a power plane layer but a wiring for power supply. Namely, the wiring for power supply formed on a substrate is formed such that the starting point of an electrical connection is directly below the third pad to which a wire 110 is connected up to the point directly below each of the first pads for power supply.

The wiring for power supply can be, for example, no less than 10 μm in width from the standpoint of having the wiring resistance thereof low. Having the wiring resistance of the wiring for power supply low controls the voltage drop inside an interposer, allowing an appropriate supply voltage to be applied to a semiconductor element. The present exemplary aspect can exhibit the effects of (1), (2) as well as (4) through (9) described under the first exemplary aspect.

Figure 14:
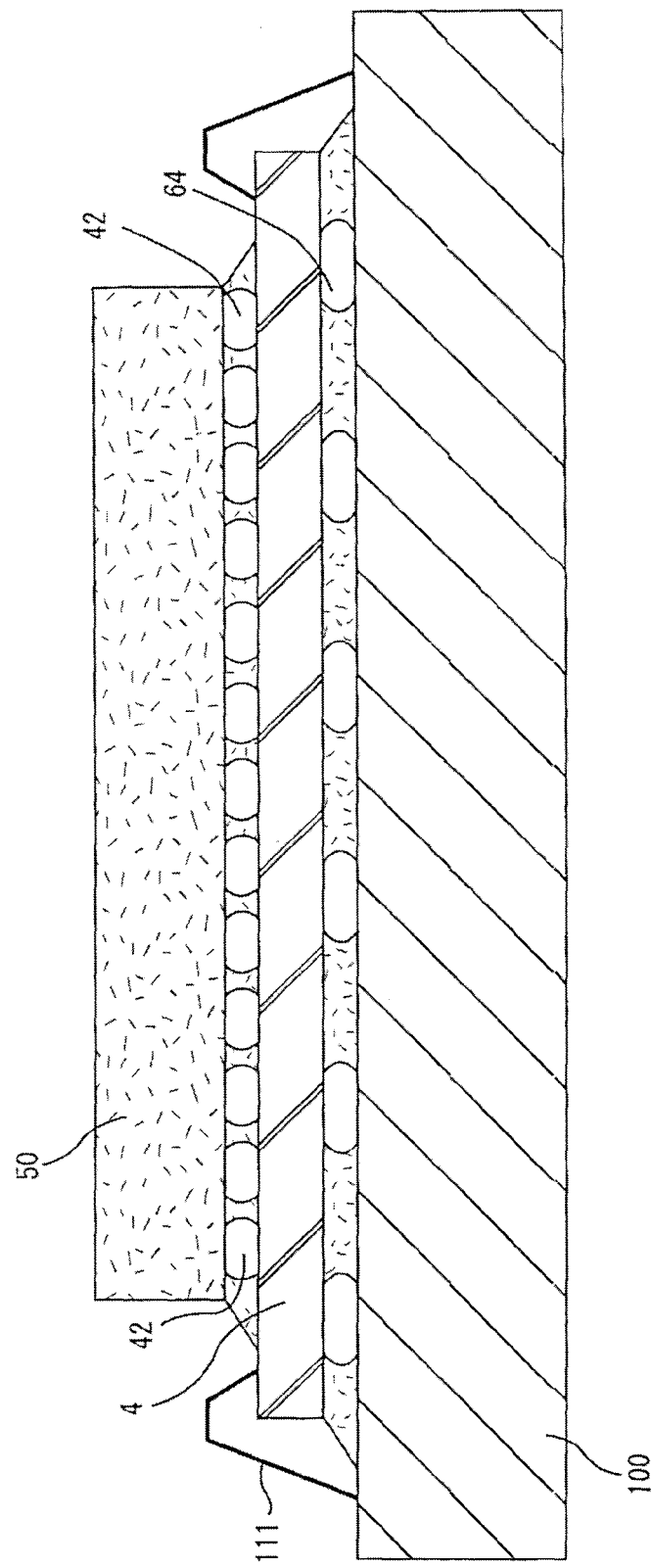
FIG. 14 is a sectional view illustrating schematically one example of an interposer in accordance with the fourth exemplary aspect.

The interposer according to a fourth exemplary aspect differs from the first exemplary aspect in that a through-hole electrode is formed in a substrate, and in that a supply voltage is applied to a semiconductor element through the through-hole electrode. FIG. 14 is a sectional view illustrating schematically one example of an interposer in accordance with the fourth exemplary aspect. The semiconductor element 50 is mounted onto the interposer 4 via bumps 42, for example. In addition to the interposer 4 and the wiring substrate 100 being connected via a wire 111, they are connected via bumps 64.

Figure 15:
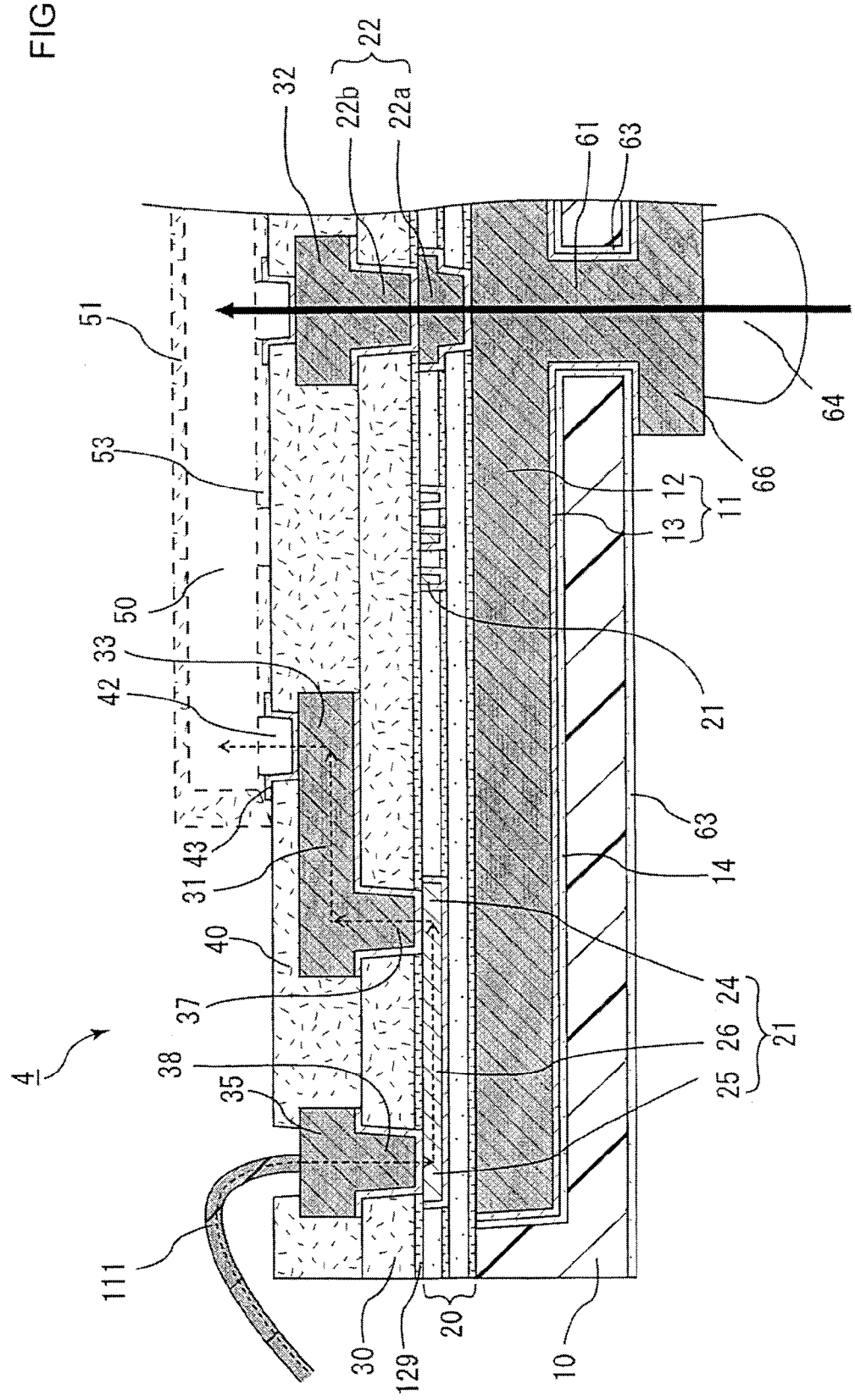
FIG. 15 is a sectional view illustrating schematically one example of a portion of an interposer in accordance with the fourth exemplary aspect.

FIG. 15 is a sectional view illustrating schematically one example of a portion of an interposer 4 in accordance with the fourth exemplary aspect. A through hole opening is formed in the lower face (the rear face) of the substrate 10, and a through-hole electrode 61 is formed in the through hole. The through-hole electrode 61 electrically connects the connection conductor 22 on the upper face (the front face) of the substrate 10 and the pad 66 (a wiring) on the lower face of the substrate 10. A supply voltage can be applied to a semiconductor element from the through-hole electrode 61 via the conductor portion 11.

The substrate 10 (excluding the conductor portion 11) and the through-hole electrode 61 are separated by an insulating film 63. The insulating film 63 is also formed on the rear face of the substrate 10. The through-hole electrode 61 can be, for example, 20 to 200 μm in diameter. Each through-hole electrode 61 may be provided directly underneath each first pad 32 or may be provided at a location away from the location directly underneath each first pad 32. When the through-hole electrode 61 is provided directly underneath the first pad 32 and the through-hole electrode 61 and the connection conductor 22 are linearly disposed, a supply voltage is applied to a semiconductor element linearly through the shortest path. Accordingly, the wiring resistance increase is controlled and the voltage drop up to the semiconductor element can effectively be controlled.

An external terminal, such as a bump 64, is formed on the pad 66 on the lower face of the substrate. In the present example, since the supply voltage is supplied via an through-hole electrode, the third pad to which a wire would be connected to supply the supply voltage and the third via conductor to which third pad would be connected are not formed.

A method of manufacturing an interposer in accordance with the fourth exemplary aspect is nearly the same as a method of manufacturing an interposer in accordance with the first exemplary aspect, excluding a step of forming a through-hole electrode. Accordingly, of a method of manufacturing an interposer in accordance with the fourth exemplary aspect, a step differing from a method of manufacturing an interposer in accordance with the first exemplary aspect will be described.

Figure 16:
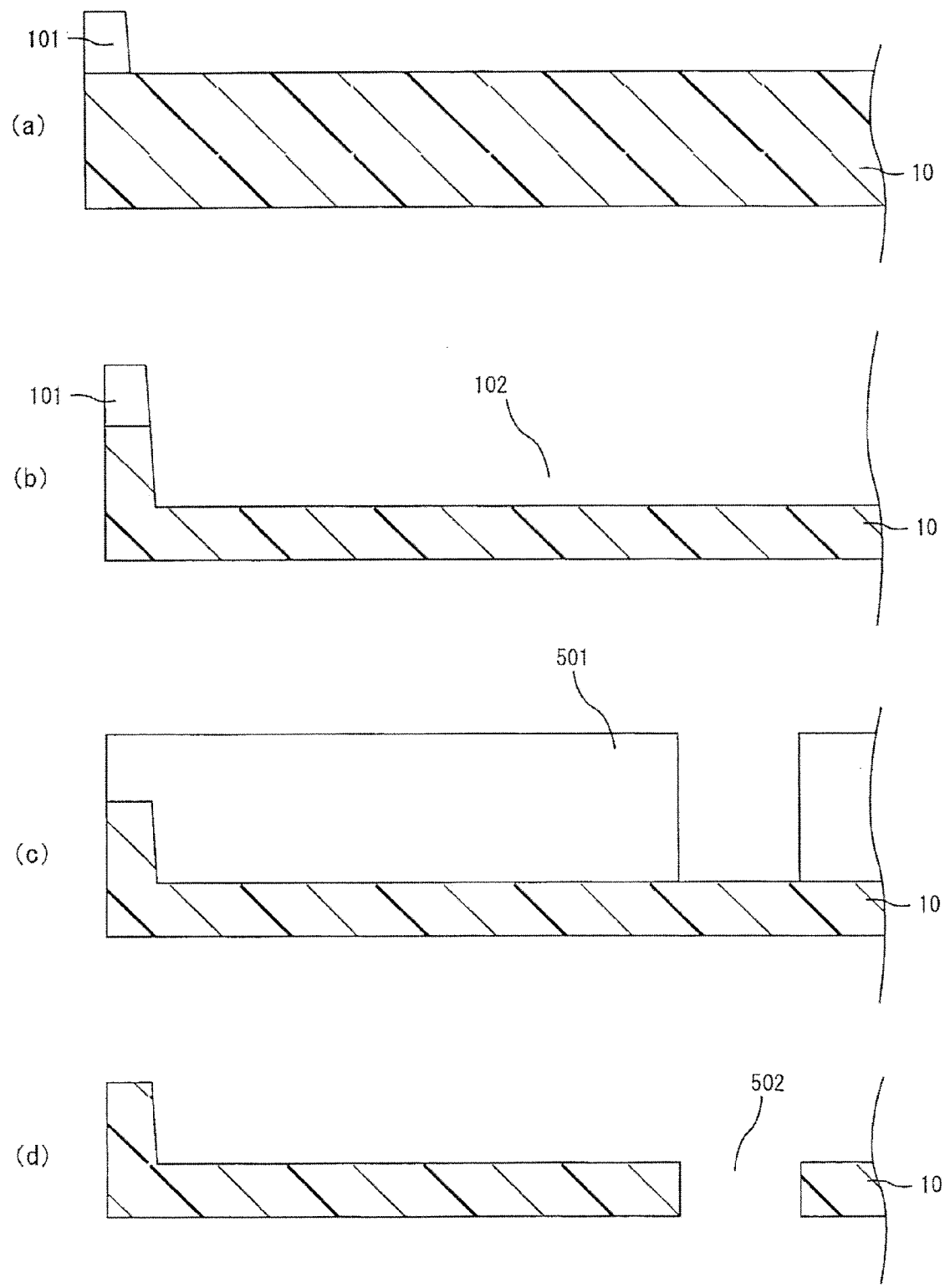
FIGS. 16(a)-(d) are sectional views illustrating schematically a portion of the manufacturing process of an interposer in accordance with the fourth exemplary aspect.

FIGS. 16(a)-(d), FIGS. 17(a)-(c), and FIGS. 17(a)-(c) are sectional views illustrating schematically a portion of the manufacturing process of an interposer in accordance with the fourth exemplary aspect. First, as illustrated in FIG. 16(a) and FIG. (b), a resist pattern 101 is formed on a substrate 10 composed of a silicon wafer, and a portion on which the resist pattern 101 has not been formed is etched to form an indented portion 102.

Next, as illustrated in FIG. 16(c), a resist pattern 501 is formed on the substrate 10. Next, as illustrated in FIG. 16(d), the site on the substrate 10 where the resist pattern 501 is not formed is etched with dry etching (reactive ion etching) to form a through-hole electrode 502. Next, the substrate is heat-treated at 800 to 1,000° C. to form a thermal oxidation film that includes $SiO_2$ on the surface of the substrate 10. This thermal oxidation film will constitute an insulating film 63 (refer to FIG. 17(a)).

Figure 17:
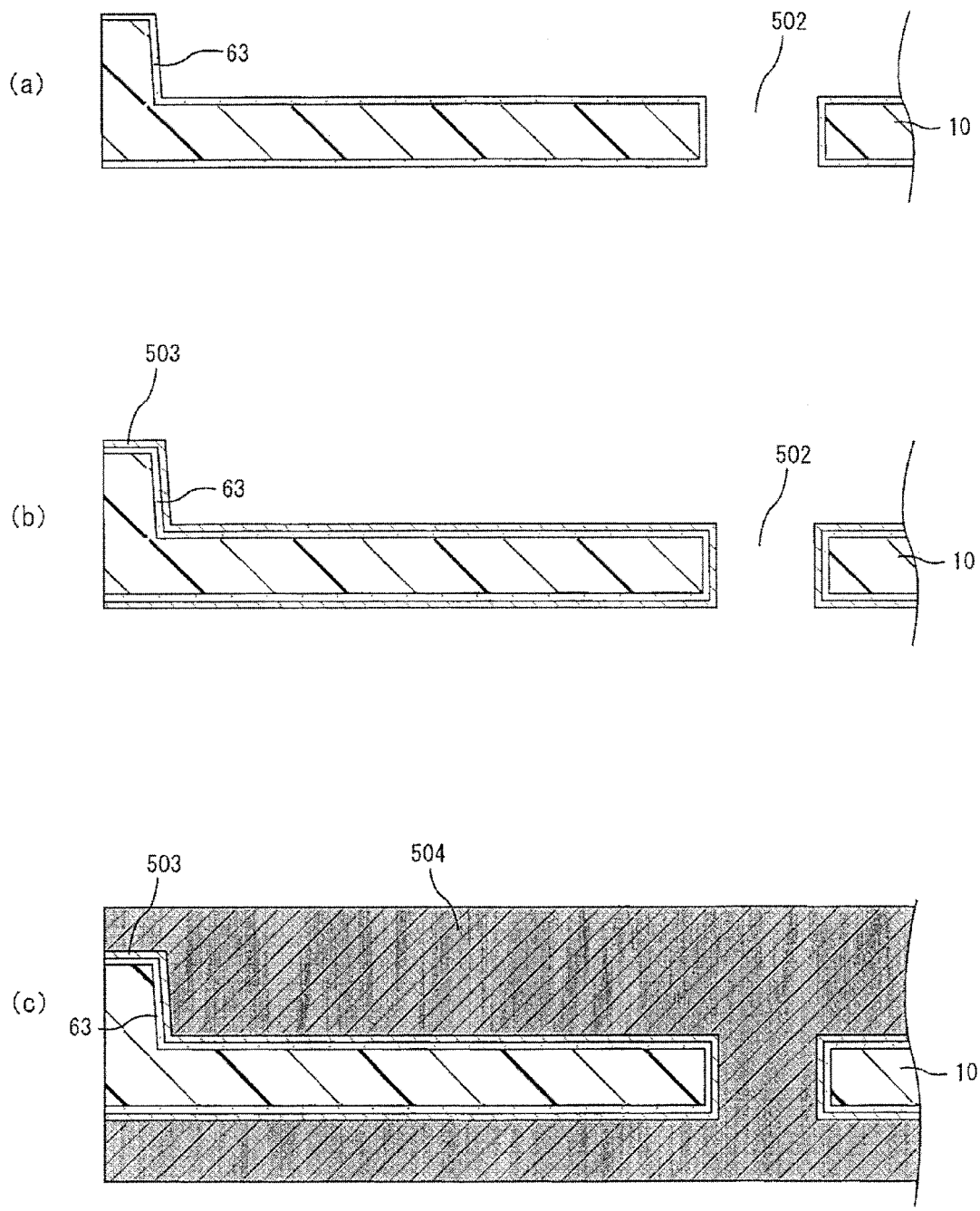
FIGS. 17(a)-(c) are sectional views illustrating schematically a portion of the manufacturing process of an interposer in accordance with the fourth exemplary aspect.
Figure 18:
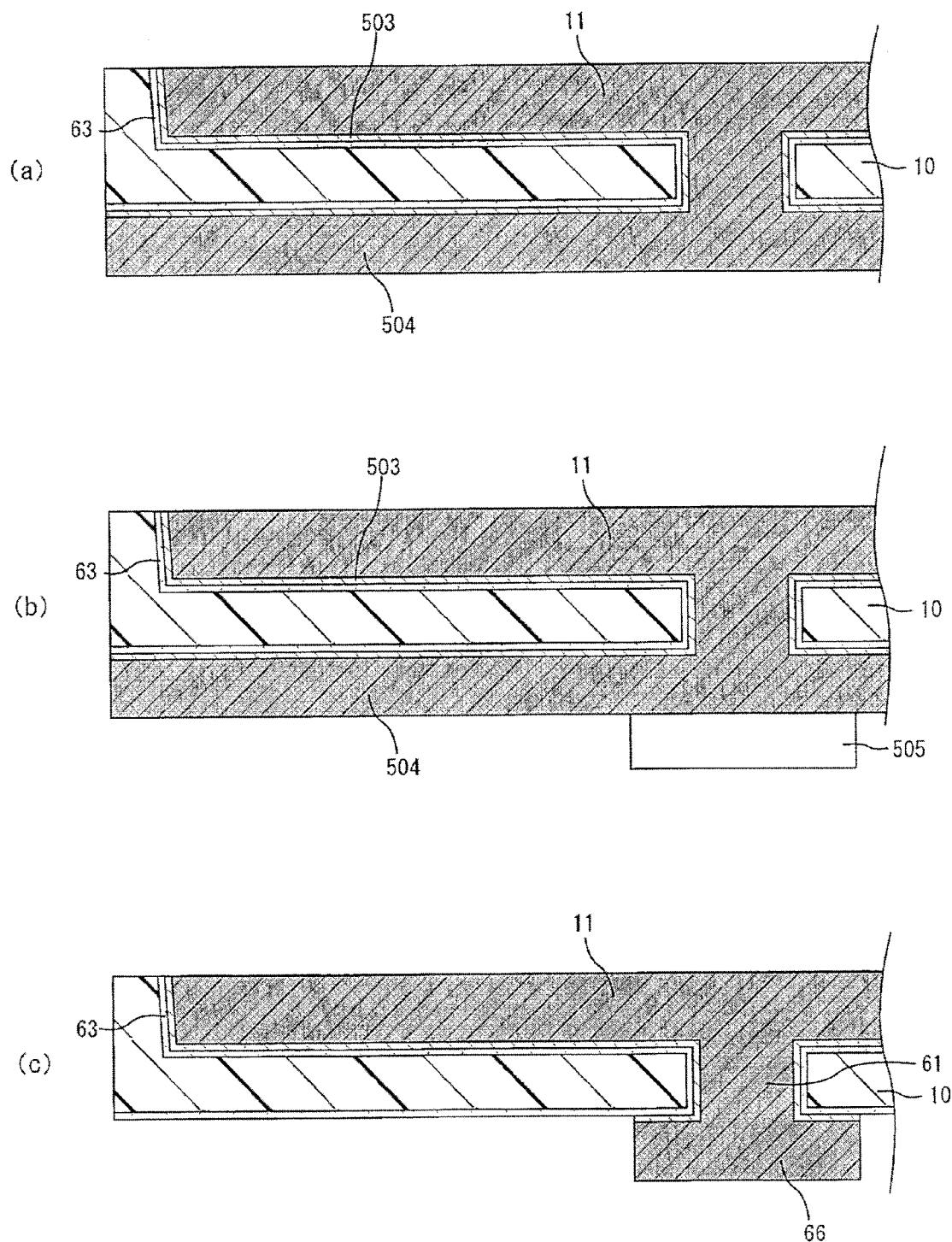

Next, as illustrated in FIG. 17(b), a conductor thin film 503 that includes Ni/Cu by sputtering, for example, on the surface of the insulating film 63. The constitution of the conductor thin film 503 is not particularly limited. In the present example, the conductor thin film 503 may be formed, for example, with electroless plating.

Next, as illustrated in FIG. 17(c), the substrate is electrolytic-copper-plated with the conductor thin film 503 as a power supply layer to form an electrolytic copper plating layer 504 on both faces of the substrate. It will suffice to undertake electrolytic copper plating with a method conventionally known to the public. Both faces of the substrate may concurrently be electrolytic-copper-plated, or may be electrolytic-copper-plated one face at a time. When one face is electrolytic-copper-plated at a time, a sheet is formed on the entirety of the lower face of the substrate such that the through hole is filled in, and the upper face of the substrate and the inside of the through hole are first plated. Subsequently, the sheet is removed and the lower face of the substrate is plated.

Next, as illustrated in FIG. 17(a), the substrate is subjected to CMP (Chemical Mechanical Polishing) to undertake planarization such that the conductor thin film 503 and the insulating film 63 at the site where the indented portion 102 is not formed are removed. Thus, a conductor portion 11 is formed at the site inside the substrate 10 and where the indented portion 102 is formed.

Next, as illustrated in FIG. 17(b), a resist pattern 505 is formed on the lower face of the substrate 10. Next, as illustrated in FIG. 17(c), the electroplating layer 504 and the conductor thin film 503 at the site where the resist pattern 505 has not been formed are etched to form a through-hole electrode 61 and a pad 66. In this manner, the conductor portion 11 and the through-hole electrode 61 are integrally formed. Then, by undertaking the steps following the formation of an inorganic insulating layer likewise with a method of manufacturing an interposer in accordance with the first exemplary aspect, an interposer in accordance with the present exemplary aspect can be manufactured. The present exemplary aspect can exhibit the following effects while exhibiting the effects of (2) through (9) described under the first exemplary aspect.

(10) With respect to an interposer in accordance with the present exemplary aspect, a supply voltage is applied to a semiconductor element not through a wire but through a through-hole electrode. Accordingly, the present example allows, as compared to the first exemplary aspect, a supply voltage to be applied to a semiconductor element with a wiring over a short distance. As a result, an increase in resistance in the wiring going up to a semiconductor element can be controlled, allowing the voltage drop going up to a semiconductor element to be effectively controlled. Such a configuration is further effective when the through-hole electrode and the connection conductor are linearly formed.

Figure 19:
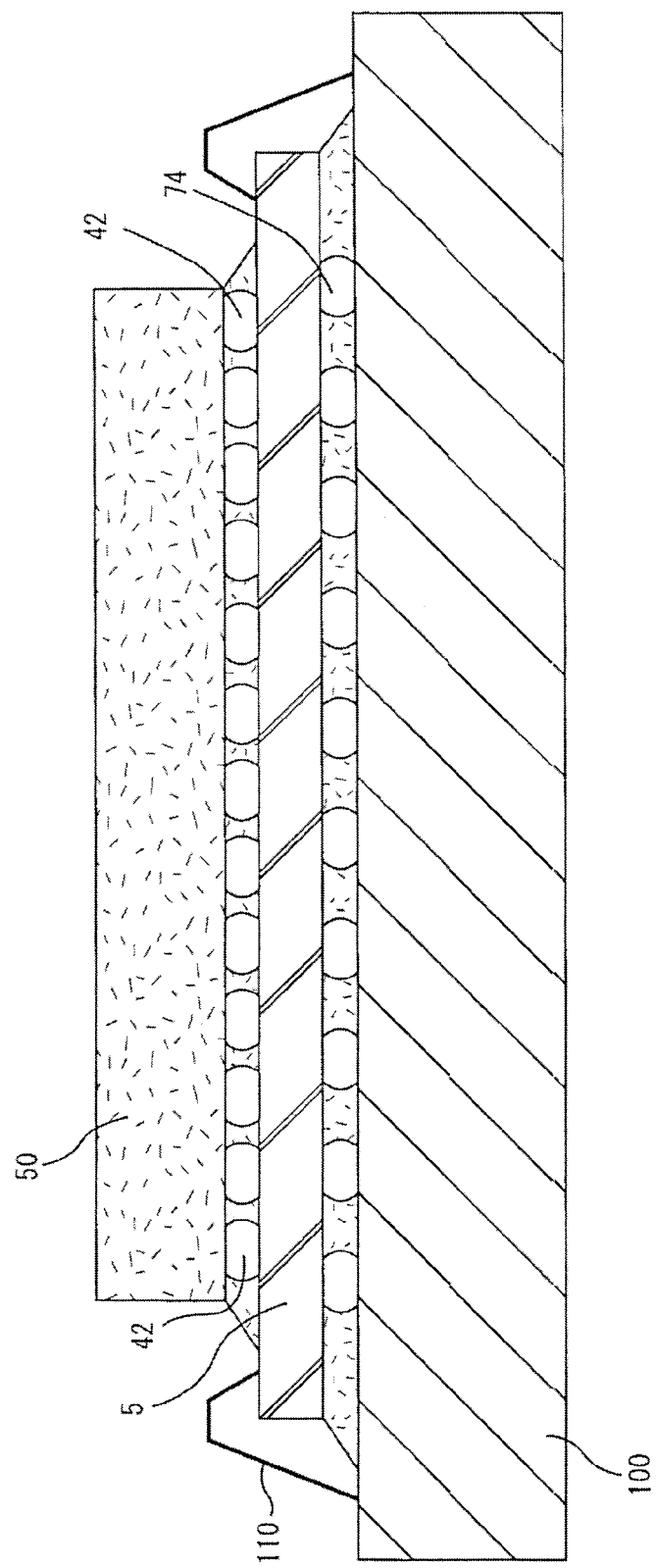
FIG. 19 is a sectional view illustrating schematically one example of an interposer in accordance with the fifth exemplary aspect.

An interposer in accordance with a fifth exemplary aspect differs from the first exemplary aspect in that a through-hole electrode is formed in a substrate and that a signal voltage is applied to a semiconductor element via the through-hole electrode. FIG. 19 is a sectional view illustrating schematically one example of an interposer in accordance with the fifth exemplary. An interposer in accordance with the present exemplary aspect is sandwiched, as illustrated in FIG. 19, between a semiconductor element 50 and a wiring substrate 100. The semiconductor element 50 is mounted onto an interposer 5 via bumps 42, for example, as with the first exemplary aspect. The interposer 5 and the wiring substrate 100 are connected via bumps 74, in addition to being connected via a wire 110.

Figure 20:
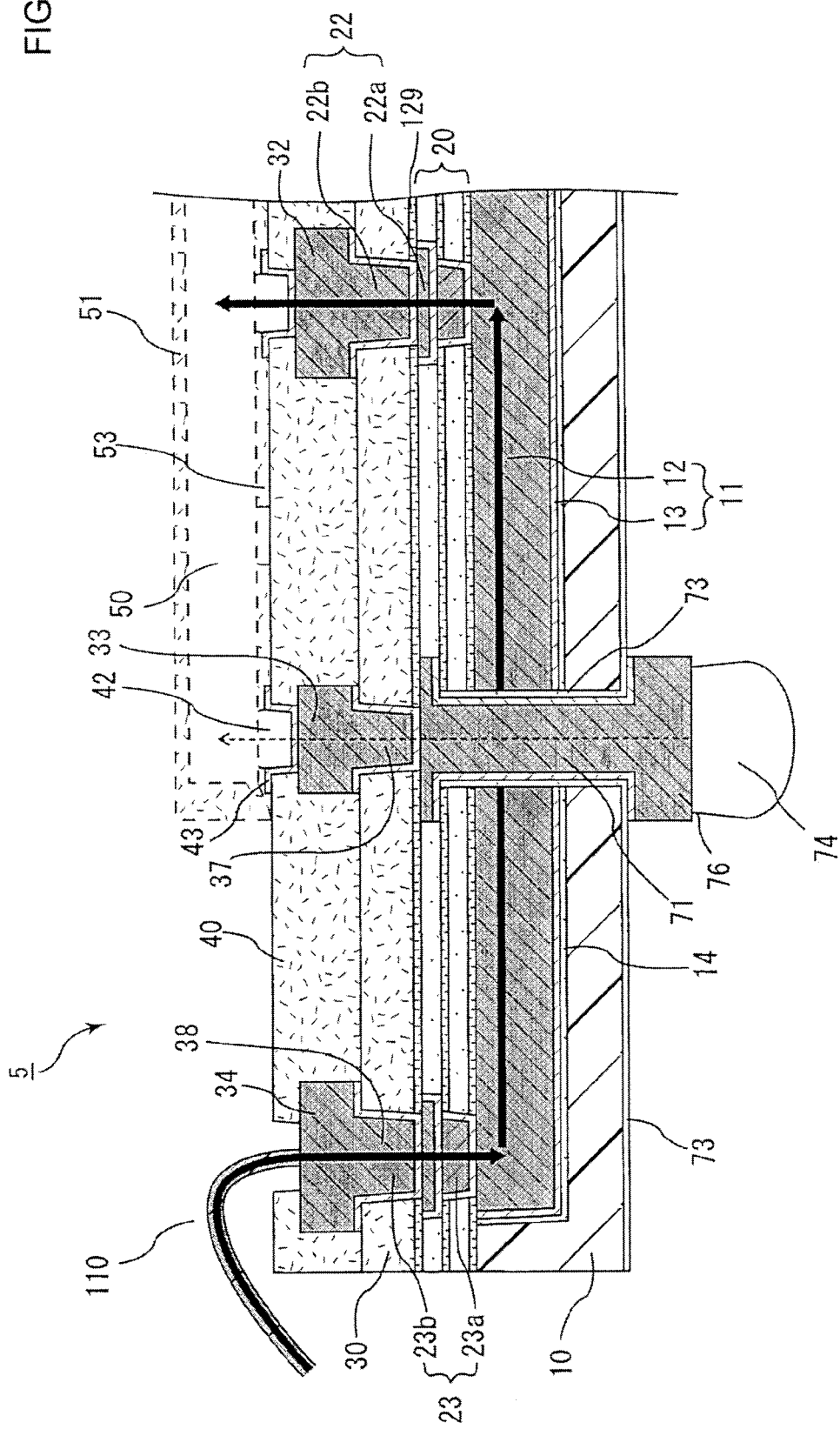
FIG. 20 is a sectional view illustrating schematically one example of a portion of an interposer in accordance with the fifth exemplary aspect.

FIG. 20 is a sectional view illustrating schematically one example of a portion of an interposer in accordance with the fifth exemplary aspect. As can be seen with respect to the interposer 5 illustrated in FIG. 20, a through hole is formed in the lower face (the rear face) of the substrate 10, and a through-hole electrode 71 is formed in the through hole. The through-hole electrode 71 electrically connects the second via conductor 37 on the upper face (the front face) of the substrate 10 and the pad 76 (a wiring) on the lower face of the substrate 10. A supply voltage can be applied to a semiconductor element from the through-hole electrode 71 via the second via conductor 37.

The substrate 10, as well as the conductor portion 11 inside the substrate 10 and the through-hole electrode 71, are separated by an insulating film 73. The insulating film 73 is also formed on the rear face of the substrate 10.

The through-hole electrode 71 can be, for example, 50 to 150 μm in diameter. Each through-hole electrode 71 may be provided directly underneath each second pad 33 and the second via conductor 37 and may be provided at a location away from the location directly underneath each second pad 33. Namely, the second pad 33 and the through-hole electrode 71 may be connected via the second via conductor 37 and the first wiring (not illustrated).

In addition, when the through-hole electrode 71 is provided directly underneath the second pad 33 and the second via conductor 37 and the through-hole electrode 71 and the second via conductor 37 are linearly disposed, a signal voltage is applied to a semiconductor element linearly through the shortest path. Accordingly, the present example allows a faster signal transmission speed.

Since the signal voltage is supplied via a through-hole electrode in an interposer in accordance with the fifth exemplary aspect, the fourth pad to which a wire would be connected to supply the same voltage and the fourth via conductor to which the fourth pad would be connected are not formed.

A method of manufacturing an interposer in accordance with the fifth exemplary aspect is nearly the same as a method of manufacturing an interposer in accordance with the first exemplary aspect, excluding a step of forming a through-hole electrode. Accordingly, a step of the method of manufacturing an interposer in accordance with the fifth exemplary aspect that differs from a method of manufacturing an interposer in accordance with the first exemplary aspect will be described.

FIGS. 21(a)-(c), FIGS. 22(a)-(d), FIGS. 23(a)-(c), FIGS. 24(a)-(c), and FIGS. 25(a)-(c) are sectional views schematically illustrating a portion of the manufacturing process of an interposer in accordance with the fifth exemplary aspect. In the present example, a conductor portion 11 is formed inside a substrate 10. Inorganic insulating layers (the first $Si_3N_4$ layer 121, the first $SiO_2$ layer 122, and the second $Si_3N_4$ layer 123) are formed on the substrate 10 and on the conductor portion 11 with CVD, for example, as was discussed above as with a method of manufacturing an interposer in accordance with the first exemplary aspect (refer to FIG. 21(a)).

Next, after as a resist pattern (not illustrated) is provided on the second $Si_3N_4$ layer 1231, the first $Si_3N_4$ layer 121, the first $SiO_2$ layer 122, and the second $Si_3N_4$ layer 123 are sequentially removed with dry etching (reactive ion etching). A seed layer 601 is formed, an electrolytic copper plating layer 602 is formed with electrolytic copper plating, and, further, it is subjected to CMP to form a via 603 (refer to FIG. 21(b)).

Figure 21:
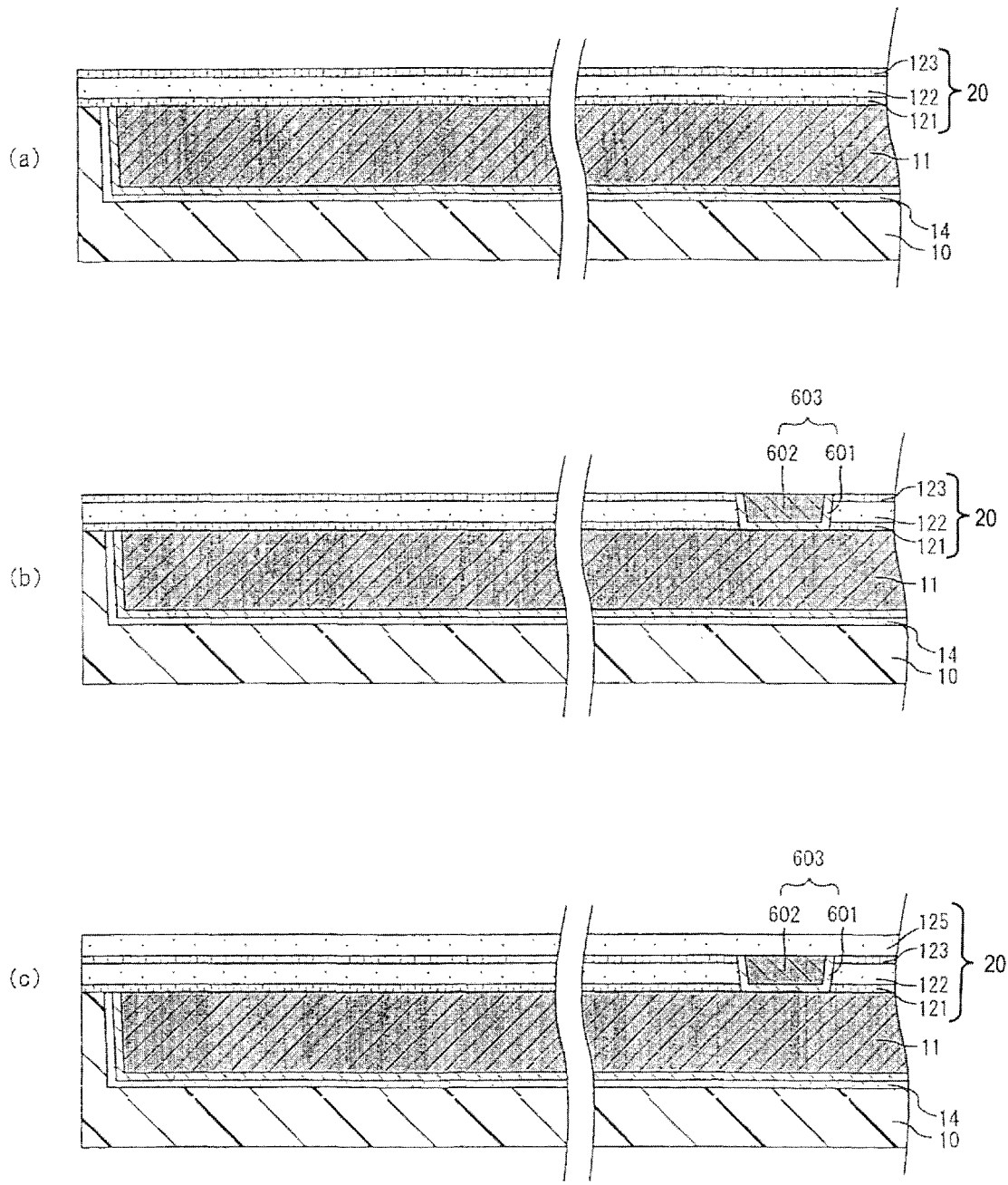
FIGS. 21(a)-(c) are sectional views illustrating schematically a portion of the manufacturing process of an interposer in accordance with the fifth exemplary aspect.

Next, as illustrated in FIG. 21(c), the second $SiO_2$ layer 125 is formed with CVD. In addition, under the present exemplary aspect as well, a layer that includes the first $Si_3N_4$ layer 121, the first $SiO_2$ layer 122, the second $Si_3N_4$ layer 123, and the second $SiO_2$ layer 125 constitutes an inorganic insulating layer 20.

Figure 22:
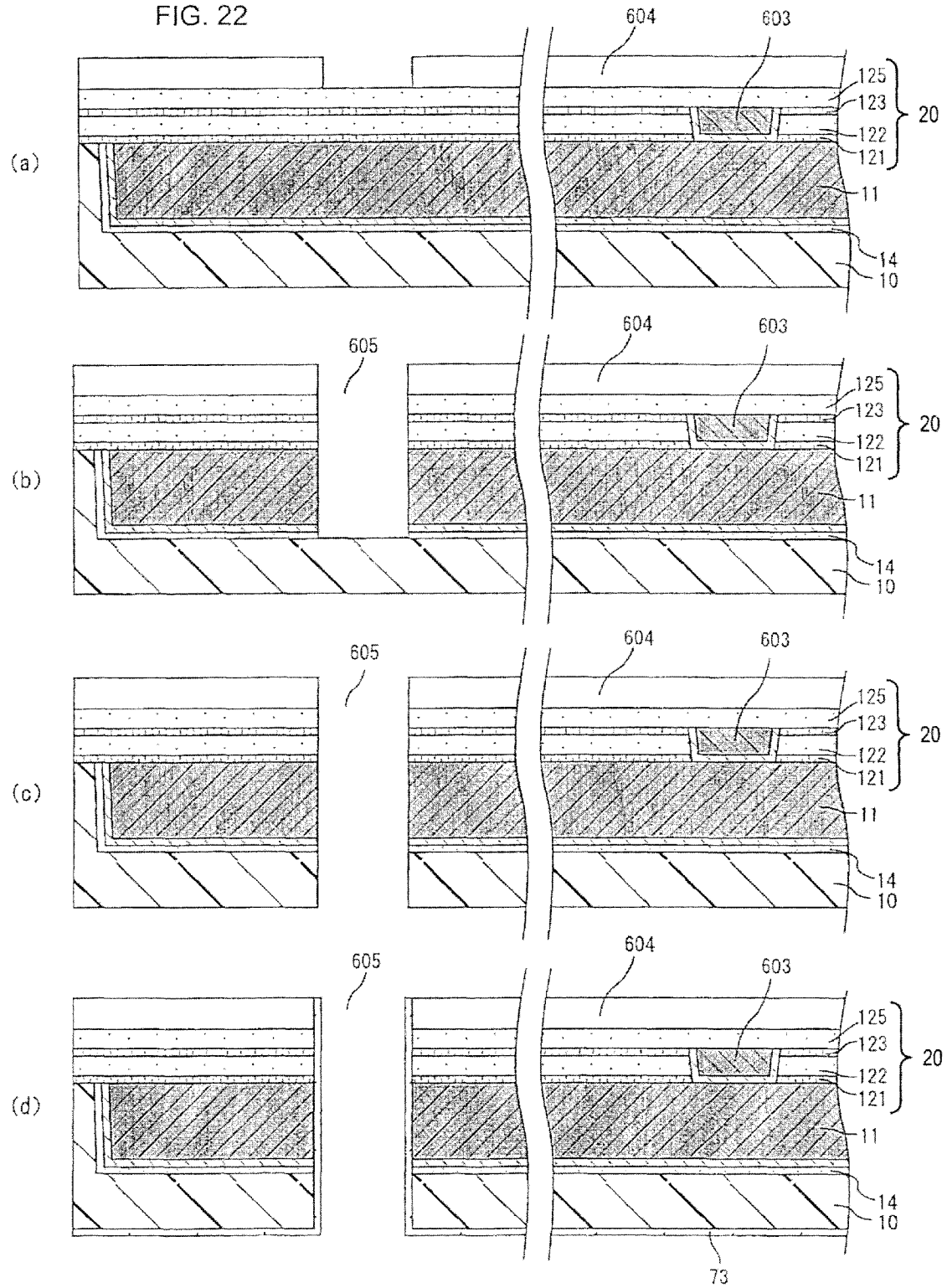
FIGS. 22(a)-(d) are sectional views illustrating schematically a portion of the manufacturing process of an interposer in accordance with the fifth exemplary aspect.

Next, a resist pattern 604 is formed on an inorganic insulating layer 20 as illustrated in FIG. 22(a). Turning to FIG. 22(b), the inorganic insulating layer 20 (the second $SiO_2$ layer 125, the second $Si_3N_4$ layer 123, the first $SiO_2$ layer 122, and the first $Si_3N_4$ layer 121) on the portion where a resist pattern is not formed is removed with dry etching (reactive ion etching). Further, the conductor layer 11 (including the conductor thin film) underneath the inorganic insulating layer 20 is removed with the use of an UV laser, for example. Next, the insulating film 14 underneath the conductor portion 11 is removed with dry etching (reactive ion etching).

Figure 23:
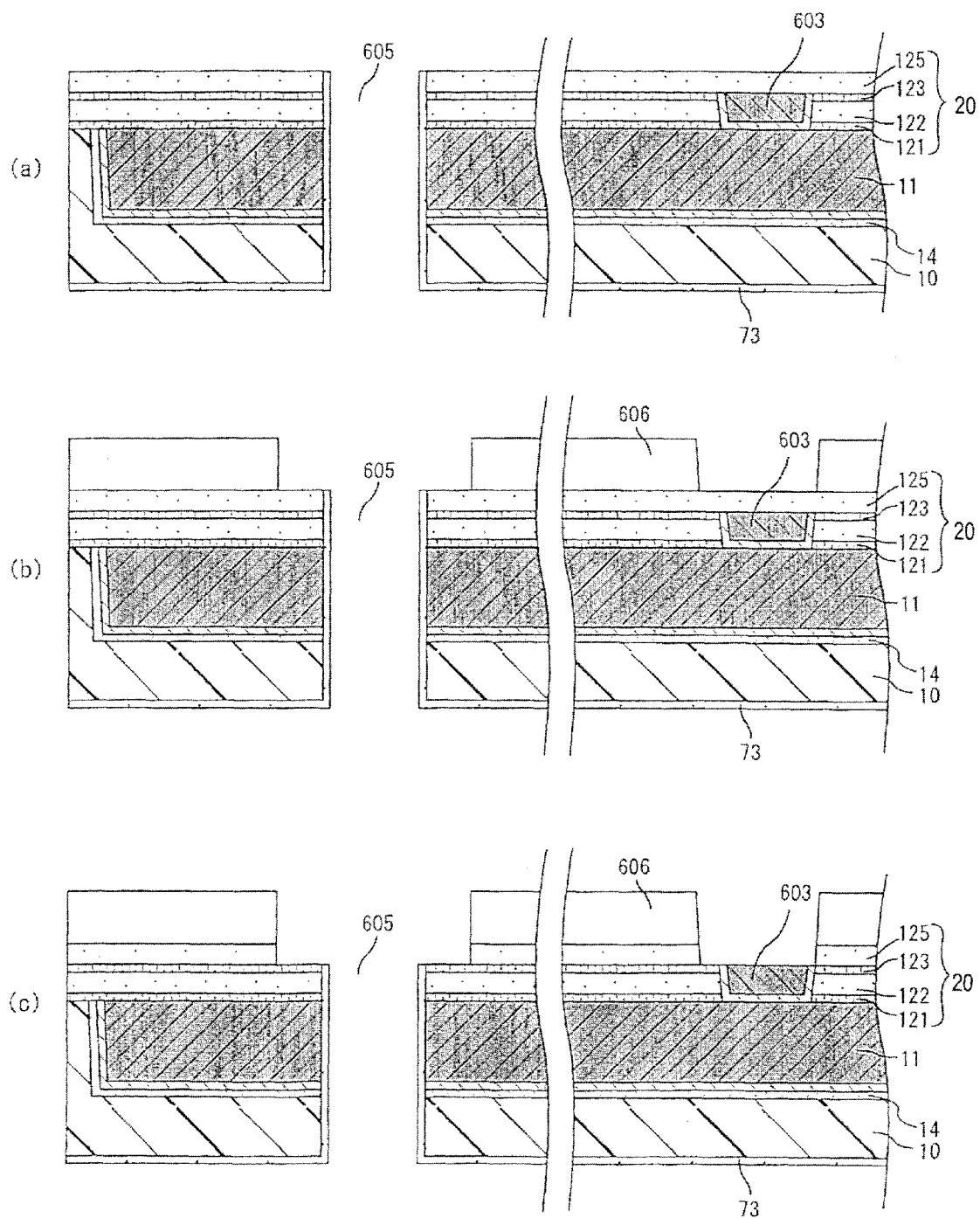
FIGS. 23(a)-(c) are sectional views illustrating schematically a portion of the manufacturing process of an interposer in accordance with the fifth exemplary aspect.

Next, as illustrated in FIG. 22(c), a through hole 605 is formed in the substrate 10 with dry etching (reactive ion etching). Next, with the use of CVD, an $SiO_2$ film is formed on the rear face of the substrate and on the surface inside the though hole 605. This $SiO_2$ constitutes an insulating film 73 (refer to FIG. 22(d)). Next, as illustrated in FIG. 23(a), following the removal of the resist pattern 604, another resist pattern 606 is formed as illustrated in FIG. 23(b). Next, as illustrated in FIG. 23(c), the second $SiO_2$ layer 125 at the site where the resist pattern 606 is not formed is removed.

Figure 24:
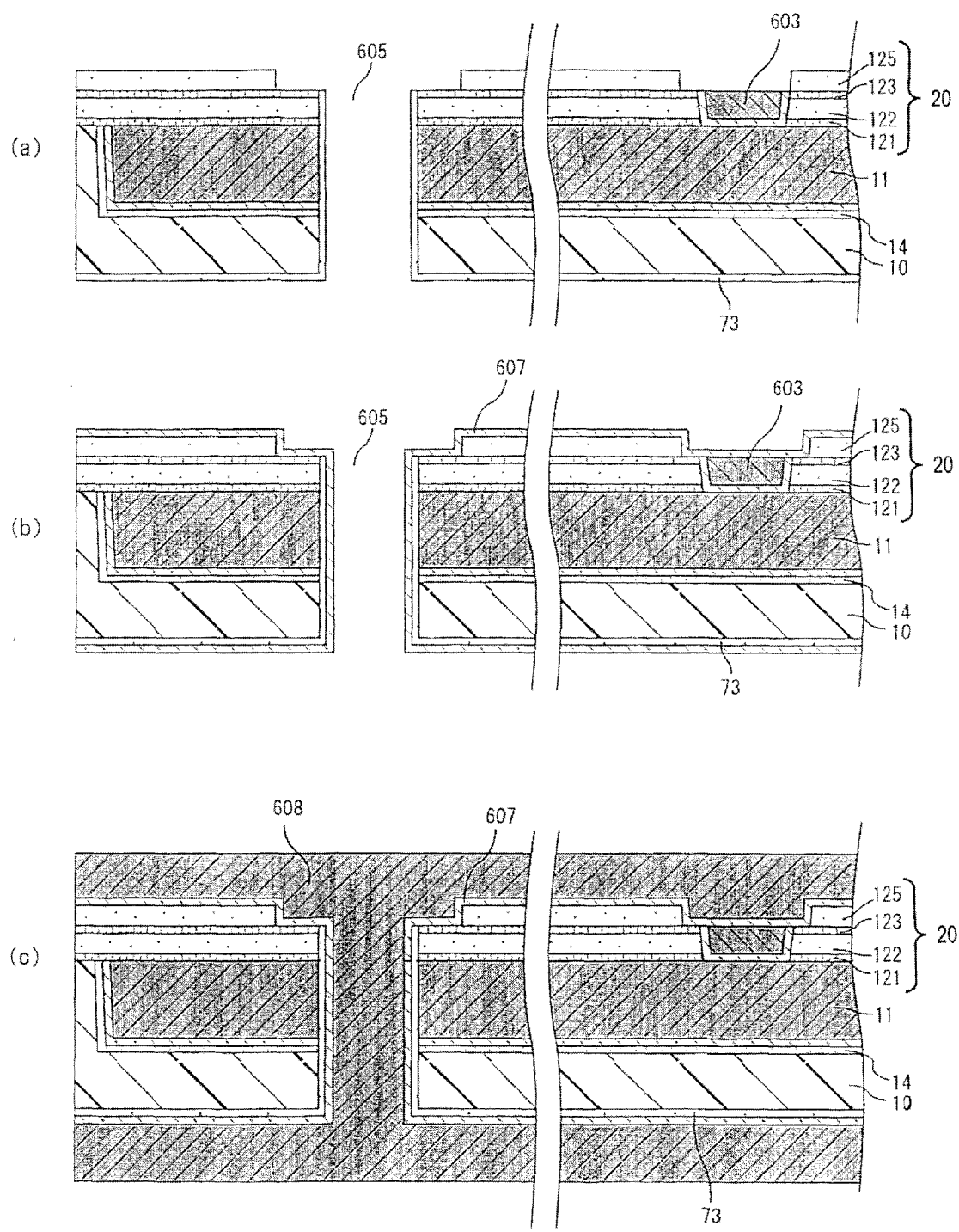
FIGS. 24(a)-(c) are sectional views illustrating schematically a portion of the manufacturing process of an interposer in accordance with the fifth exemplary aspect.

Next, as illustrated in FIGS. 24(a), 24(b), and 24(c), the removal of the resist pattern 606, the formation of a conductor thin film 607 by sputtering, and the formation of an electrolytic copper plating layer 608 onto both faces of the substrate 10 with electrolytic copper plating are undertaken. In addition, the formation of electrolytic copper plating layer on both faces of the substrate may be undertaken concurrently or may be undertaken one face at a time, as with a method of manufacturing an interposer in accordance with the fourth exemplary aspect.

Figure 25:
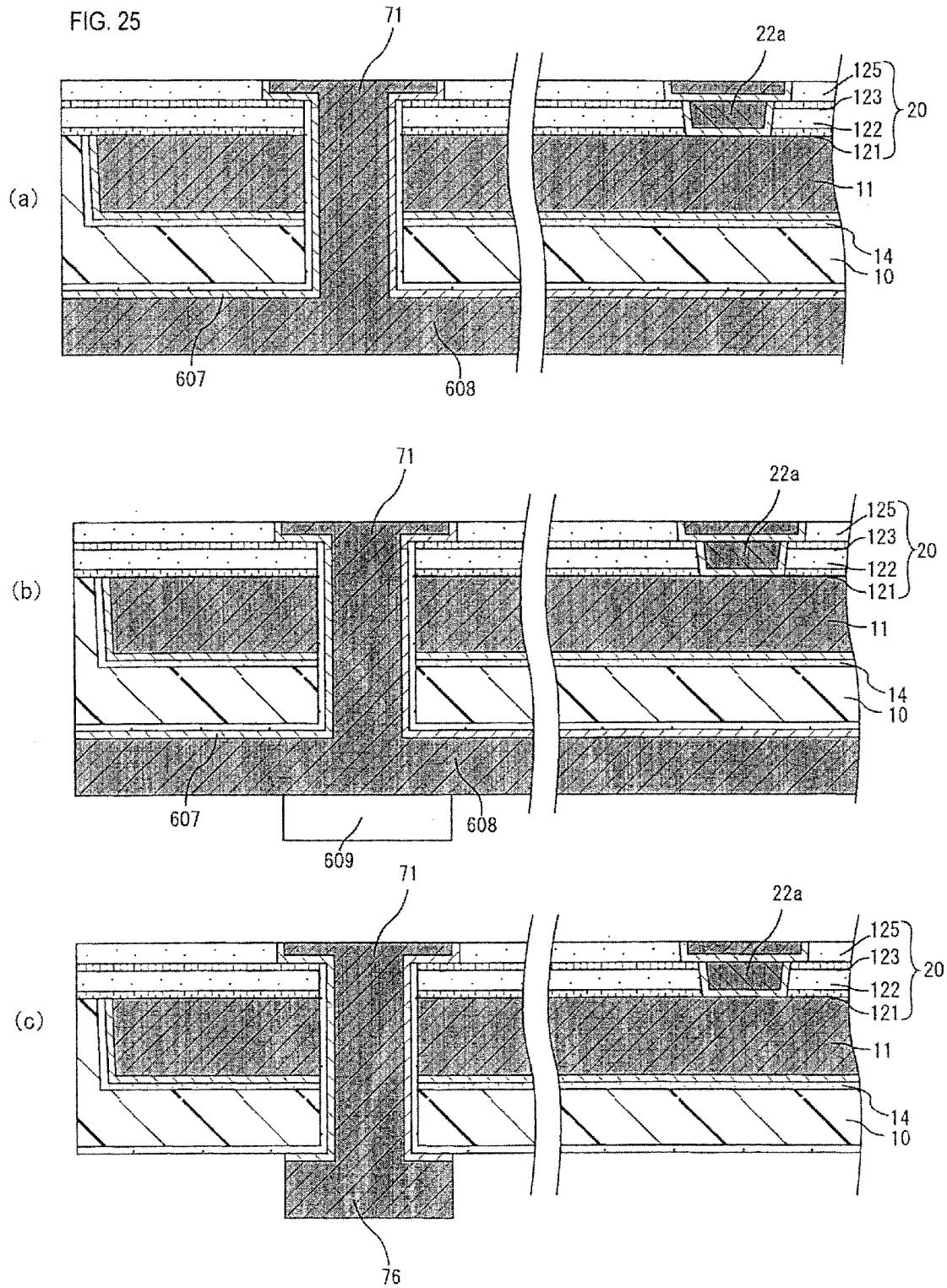
FIGS. 25(a)-(c) are sectional views illustrating schematically a portion of the manufacturing process of an interposer in accordance with the fifth exemplary aspect.

Then, as illustrated in FIG. 25(a), the substrate is subjected to CMP until the second $SiO_2$ layer 125 is exposed. This forms the upper face portion of the through-hole electrode 71 and at the same time the first via conductor 22a is formed. Next, as illustrated in FIG. 25(b), a resist pattern 609 is formed on the lower face of the substrate 10. Then, as illustrated in FIG. 25(c), the electroplating layer 608 at the site where the resist pattern 609 is not formed and the conductor thin film 607 are etched to form the through-hole electrode 71 and a pad 76. Subsequently, by the steps following the formation of the organic insulating layer being undertaken as with a method of manufacturing an interposer in accordance with the first exemplary aspect, an interposer in accordance with the present exemplary aspect can be manufactured. The present exemplary aspect can exhibit the effects of (1) through (3) as well as (5) and (8) described under the first exemplary aspect.

The present exemplary aspect differs from the first exemplary aspect in that a supply voltage and a signal voltage are applied to a semiconductor element via a through-hole electrode provided on a substrate, not a wire.

Figure 26:
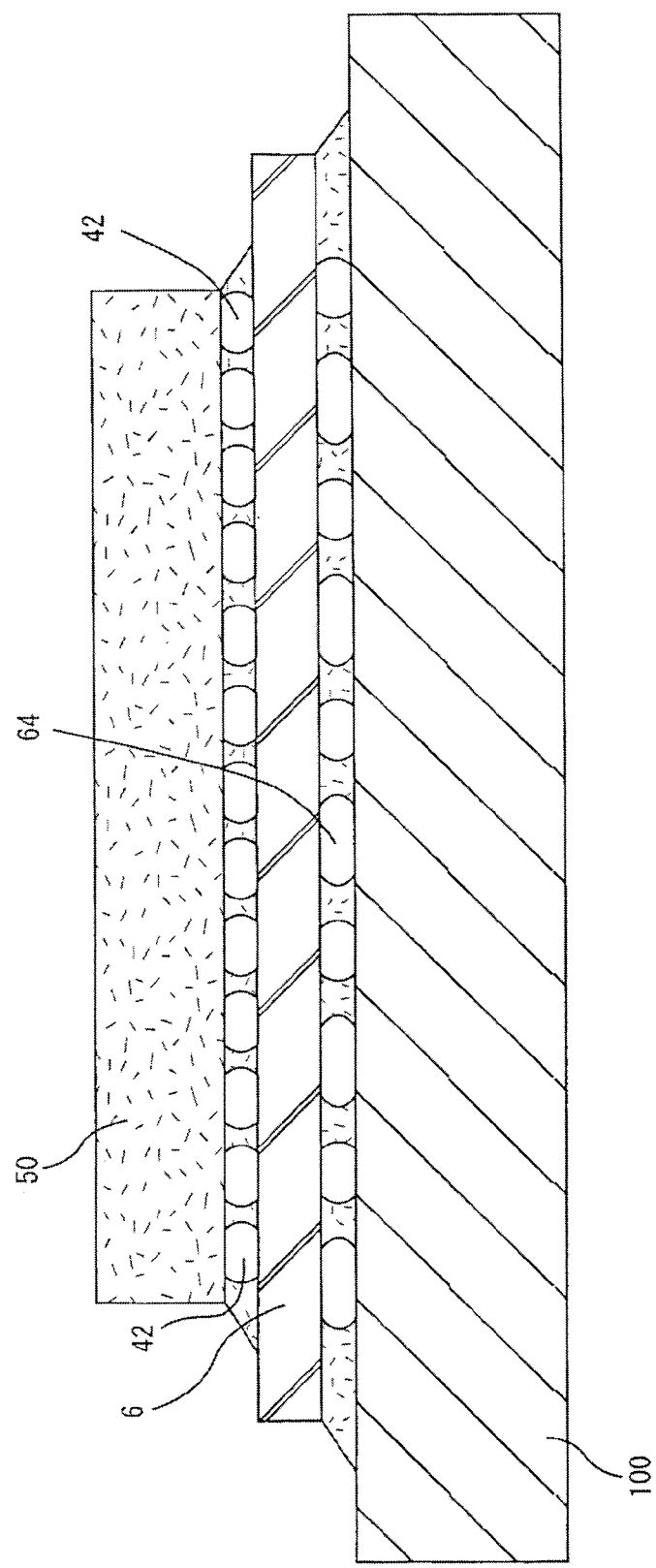
FIG. 26 is a sectional view illustrating schematically one example of an interposer in accordance with the sixth exemplary aspect.

FIG. 26 is a sectional view illustrating schematically one example of an interposer in accordance with the sixth exemplary aspect. An interposer 6 in accordance with the present exemplary aspect is sandwiched between a semiconductor element 50 and a wiring substrate 100, as illustrated in FIG. 26. The semiconductor element 50 is mounted onto the interposer 6 via bumps 42, for example. The interposer 6 and the wiring substrate 100 are connected via bumps 64 and the connection is not via a wire.

Figure 27:
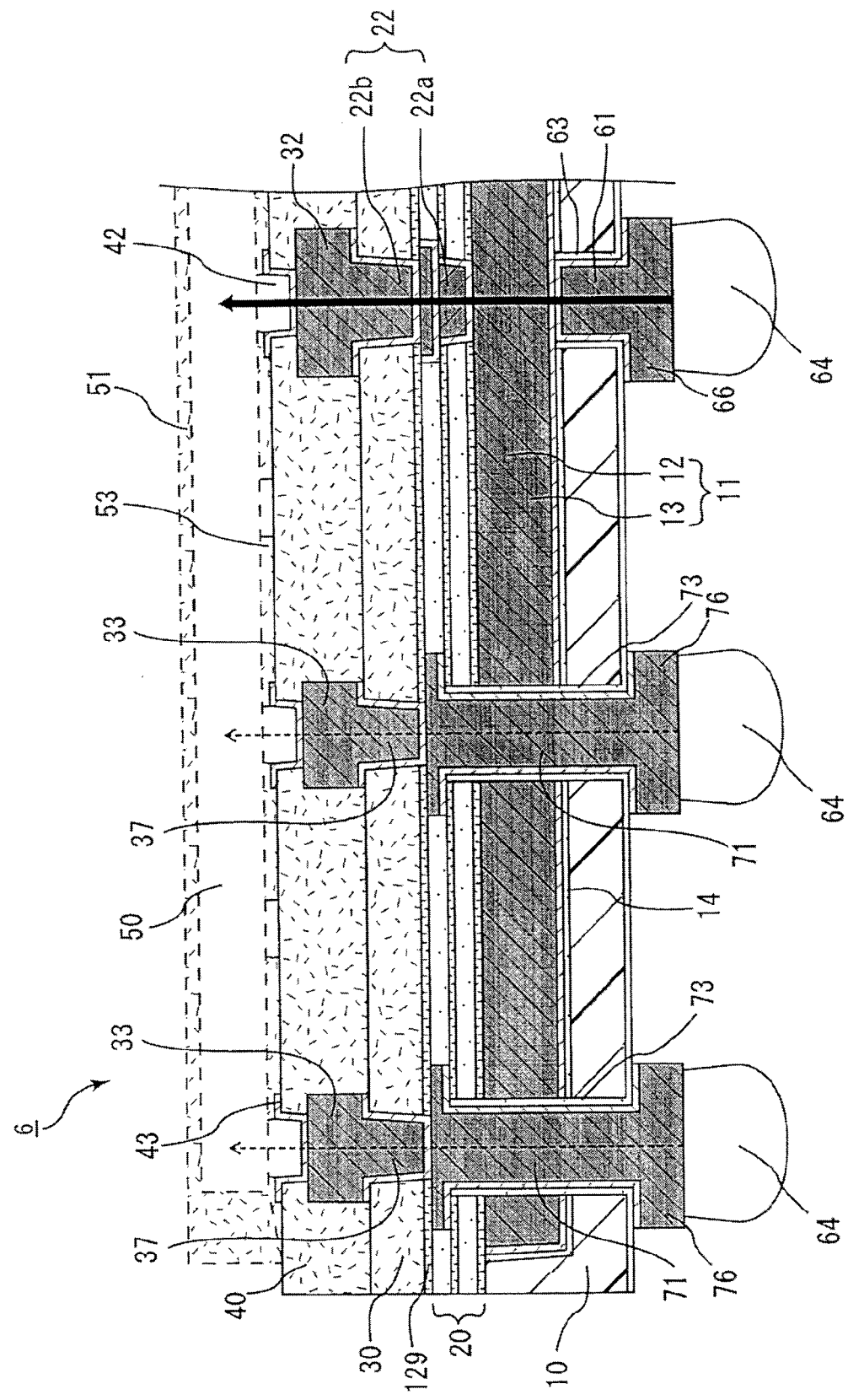
FIG. 27 is a sectional view illustrating schematically one example of a portion of an interposer in accordance with the sixth exemplary aspect.
Figure 28:
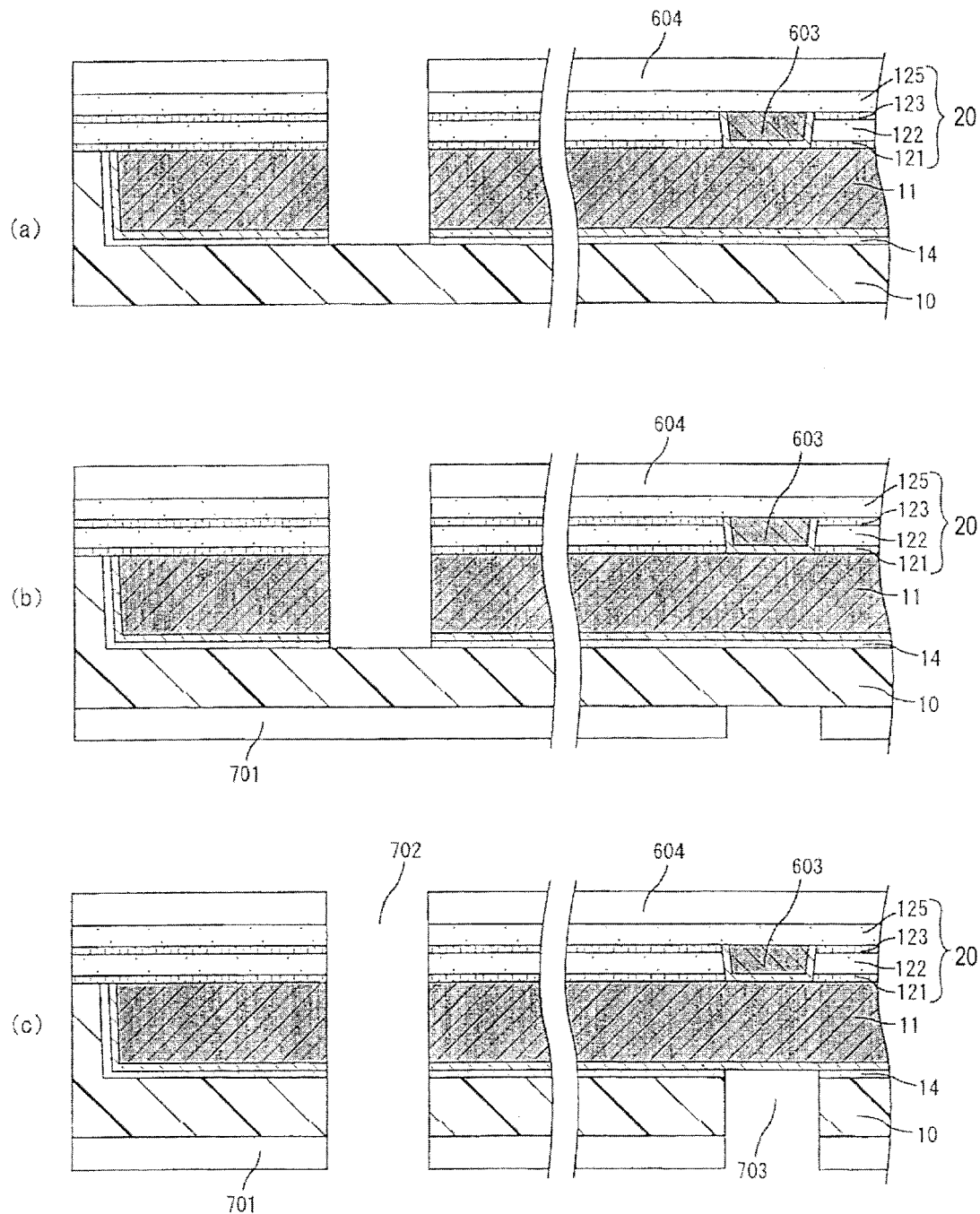

FIG. 27 is a sectional view illustrating schematically one example of a portion of an interposer in accordance with the sixth exemplary aspect. The shape of the through-hole electrode 61 for power supply is nearly the same as the interposer in accordance with the fourth exemplary aspect. The through-hole electrode 61 electrically connects a connection conductor 22 on the upper face (the surface) of the substrate 10 and a pad 66 (a wiring) on the lower face of the substrate 10. A supply voltage can be applied to a semiconductor element from the through-hole electrode 61 through a conductor portion 11.

The shape of the through-hole electrode 71 for signals is nearly the same as the interposer in accordance with the fifth exemplary aspect. The through-hole electrode 71 electrically connects the second via conductor 37 on the upper face (the surface) of the substrate 10 and a pad 76 (a wiring) on the lower face of the substrate 10. A signal voltage can be applied to a semiconductor element from the through-hole electrode 71 through the second via conductor 33. In addition, in this case, the second pad 33 and the through-hole electrode 71 may be connected via the second via conductor 37 and the first wiring (not illustrated).

For an interposer in accordance with the sixth exemplary aspect, the supply of the supply voltage and the supply of the signal voltage are undertaken via a through-hole electrode. Accordingly, the third pad, the fourth pad, the third via conductor, and the fourth via conductor are not formed.

A method of manufacturing an interposer in accordance with the sixth exemplary aspect is nearly the same as a method of manufacturing an interposer in accordance with the first exemplary aspect, excluding a step of forming a through-hole electrode. Accordingly, a step of a method of manufacturing an interposer in accordance with the sixth exemplary aspect that differs from a method of manufacturing an interposer in accordance with the first exemplary aspect will be described.

FIGS. 27(a)-(c), FIGS. 29(a)-(c), FIGS. 30(a)-(c), FIGS. 31(a)-(d), and FIGS. 32(a)-(c) are sectional views illustrating schematically a portion of the manufacturing process of an interposer in accordance with the sixth exemplary aspect. When it comes to the present exemplary aspect, a substrate of the same structure as the structure illustrated in FIG. 22(b) under the description of the fifth exemplary aspect is prepared, likewise as with the steps indicated under a method of manufacturing an interposer in accordance with the fifth exemplary aspect (refer to FIG. 27(a)).

Next, as illustrated in FIG. 27(b), a resist pattern is formed having an opening at a location where a through-hole electrode for power supply is formed on the rear face of the substrate 10. Next, as illustrated in FIG. 27(c), a predetermined location of the substrate 10 is dry-etched with the resist pattern 604 as a mask to form a through hole 702. Further, a groove portion 703 is formed by dry-etching the substrate 10 with the resist pattern 704 as a mask. Further, the insulating film 14 present deep inside the groove portion 703 is removed with dry etching to allow a conductor portion 11 on the rear side of the substrate to be exposed.

Next, as illustrated in FIG. 29(a), the resist pattern 701 on the rear side of the substrate 10 is removed. Next, as illustrated in FIG. 29(b), with the use of CVD, for example, an $SiO_2$ film 704 is formed on the rear face of the substrate 10, the surface inside the through hole 702, and the surface inside the groove portion 703. This $SiO_2$ film constitutes insulating films 63, 73 (refer to FIG. 27). Next, as illustrated in FIG. 29(c), the resist pattern 604 on the upper face side of the substrate 10 is removed.

Figure 30:
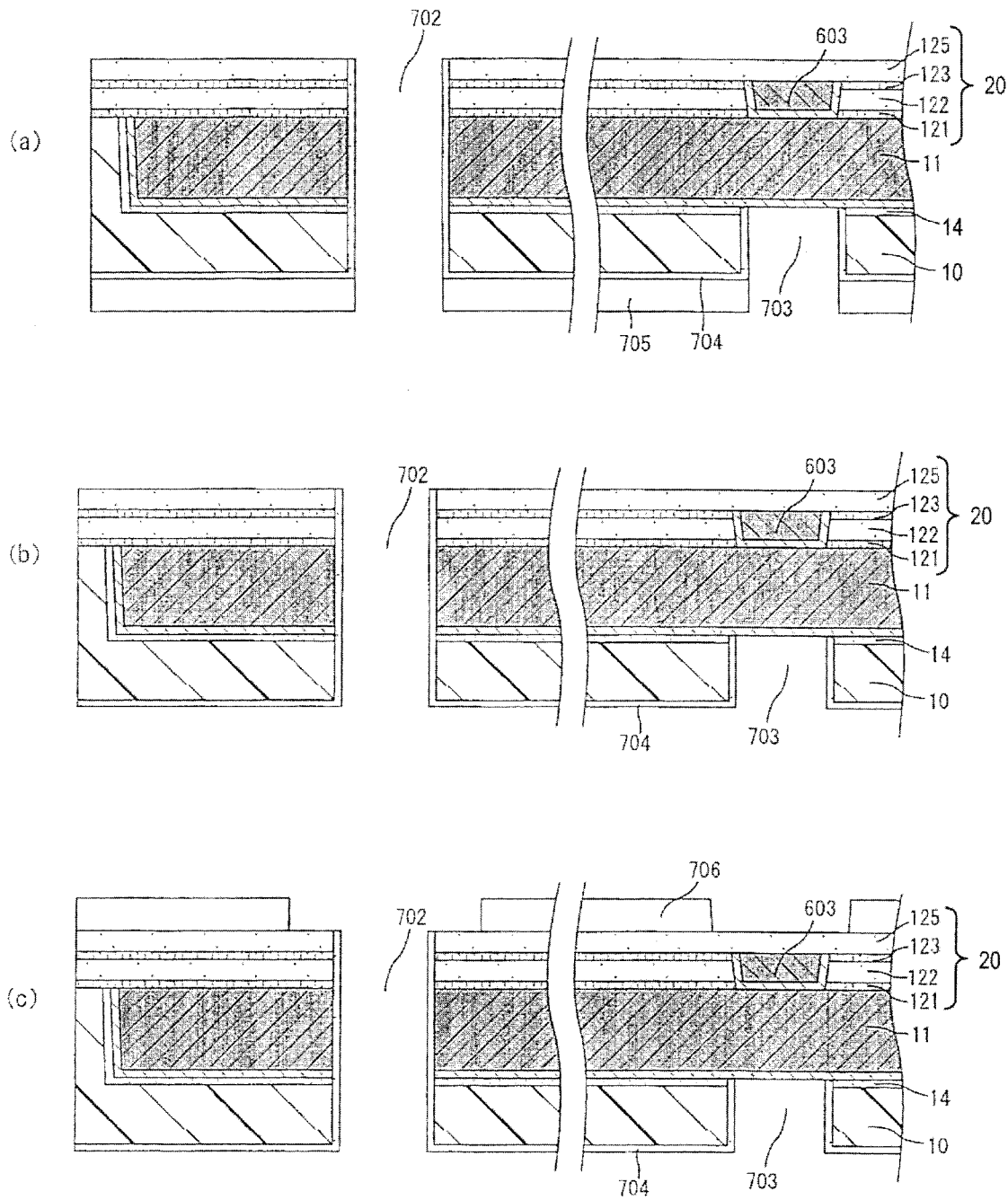
FIGS. 30(a)-(c) are sectional views illustrating schematically a portion of the manufacturing process of an interposer in accordance with the fifth exemplary aspect.

Next, as illustrated in FIG. 30(a), a resist pattern 705 is formed on the rear face of the substrate 10 such that, of the $SiO_2$ film 704 formed inside the groove portion 703, only the portion formed on the surface of the conductor portion 11 is exposed. And, the $SiO_2$ film 704 on the surface of the conductor portion 11 is removed with dry etching (reactive ion etching). Then, as illustrated in FIG. 30(b), the resist pattern 705 is removed.

Next, as illustrated in FIG. 30(c), on the second $SiO_2$ layer 125 there is formed a resist pattern 706. Next, as illustrated in FIG. 31(a) and FIG. 31(b), the second $SiO_2$ layer 125 is removed with dry etching (reactive ion etching) at the portion where a resist pattern 706 has not been formed, and, subsequently, the resist pattern 706 is removed.

Figure 31:
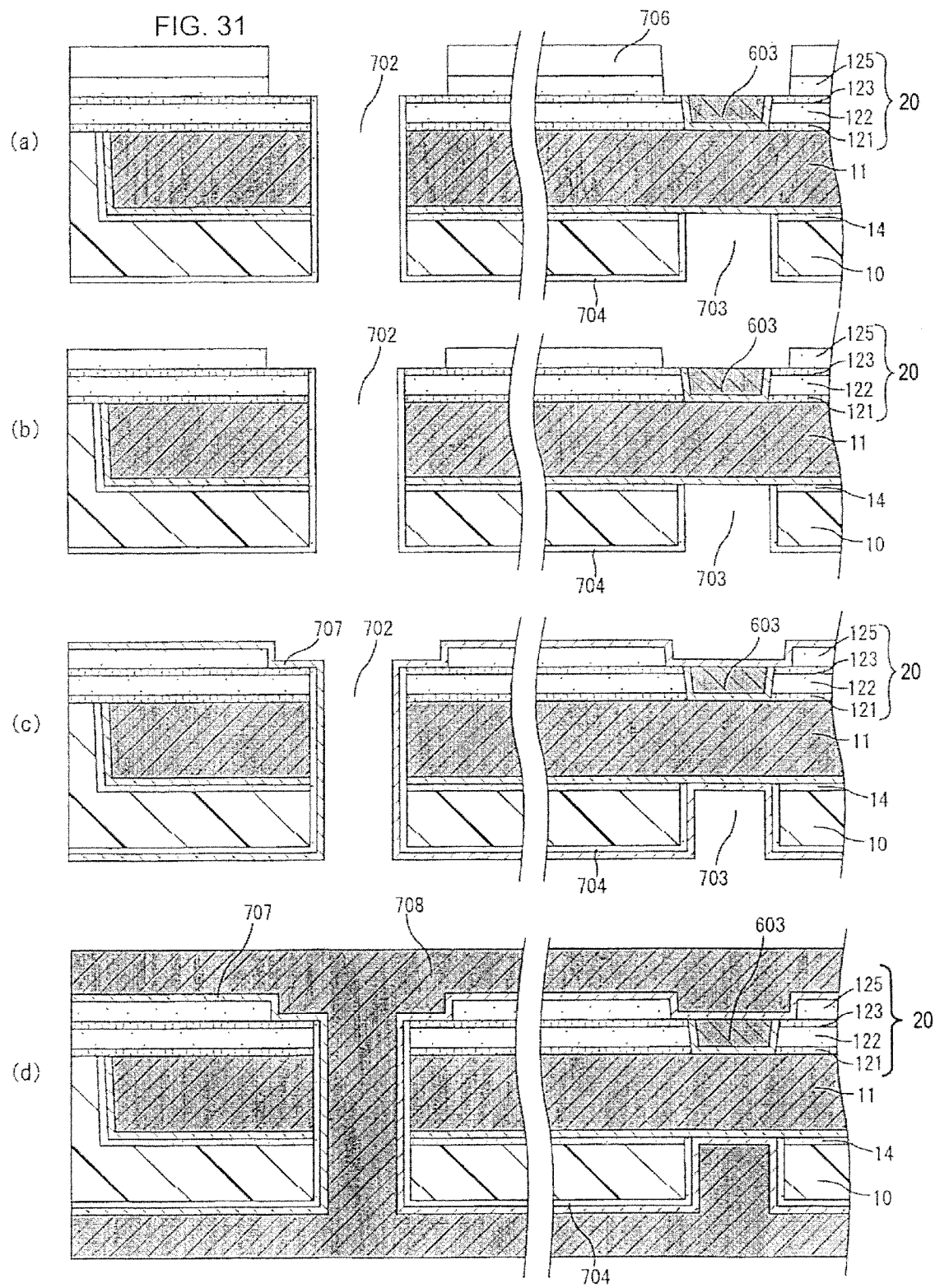
FIGS. 31(a)-(d) are sectional views illustrating schematically a portion of the manufacturing process of an interposer in accordance with the fifth exemplary aspect.

Next, as illustrated in FIG. 31(c) and FIG. 31(d), a conductor thin film 707 is formed by sputtering, and an electrolytic copper plating layer 708 is formed with electrolytic copper plating. The formation of electrolytic copper plating layer may be undertaken on both faces of the substrate concurrently or may be undertaken one face at a time, as with a method of manufacturing an interposer in accordance with the fourth exemplary aspect.

Then, as illustrated in FIG. 32(a), the substrate is subjected to CMP until the second $SiO_2$ layer 125 is exposed as to the upper face side of the substrate 10. This forms the upper face portion of the through-hole electrode 71 and at the same time the first via conductor 22a is formed.

Next, as illustrated in FIG. 32(b), a resist pattern 709 is formed on the lower face of the substrate 10. Then, as illustrated in FIG. 32(c), the electroplating layer 708 at the site where the resist pattern 709 is not formed and the conductor thin film 707 are etched to form the through-hole electrodes 61, 71 and pads 66, 76.

Subsequently, by the implementing the steps of manufacturing an interposer in accordance with the first exemplary aspect that follow the formation of the organic insulating layer, an interposer in accordance with the present exemplary aspect can be manufactured. The present exemplary aspect can exhibit the effects of (2) through (3), (5), (8), and (10) described under the first exemplary aspect or the fourth exemplary aspect.

In another exemplary aspect, a through-hole electrode for supplying a supply voltage and a pad (the third pad) for connecting a wire may together be provided inside one interposer. A through-hole electrode for supplying a signal voltage and a pad (the fourth pad) for connecting a wire may together be provided inside one interposer.

Further, a plane layer for grounding and a wiring may be formed inside a substrate 10 in accordance with the above-described exemplary aspect. In this case as well, a pad for grounding and a plane layer for grounding or a wiring are connected via a connection conductor. In the present example, a plurality of the first via conductors are linearly laminated to constitute a connection conductor 22. However, a wiring for routing may be formed between the conductor portion and the first pad, for example. The type and function of a semiconductor element to be mounted onto an interposer in accordance with the present invention are not particularly limited. Moreover, the number and loading configuration of such a semiconductor is also not particularly limited. Namely, a plurality of semiconductors may be mounted as they are laminated. In this case, through-hole electrodes provide on each individual semiconductor are connected via solder bumps, for example.

The L/S of the first wiring can be, for example, set lower as compared to the L/S of the second wiring 31. The L/S of the first wiring is not particularly limited, and while it can be, for example, around L/S=1 µm/1 µm, but it may be finer than that. The L/S of the second wiring can be, for example, around L/S=3 µm/3 µm.

Additional inorganic insulating layers and/or organic insulating layers may provided and the first wiring and/or the second wiring may be multilayer wiring. With respect to the first through the sixth exemplary aspects, while an inorganic insulating layer and an organic insulating layer are formed on a substrate, the constitution of insulating layers is not limited to this. Namely, insulating layers on a substrate may be formed of inorganic materials only, or formed of organic materials only. In this case, a method of forming wiring is not particularly limited.

As to the materials constituting the first wiring, the conductor portion, and the second wiring are not particularly limited as long as they are conductive materials. Nickel, gold, silver, etc., besides copper can be utilized.

As to the types of organic insulating layers, epoxy resin, phenol resin, polyimide resin, polyester resin, bismaleimide resin, polyolefin group resin, polyphenylene ether resin, polyphenylene resin, fluorine resin, etc., for example, can be implemented as thermosetting resins. In addition, acrylic resin, etc., for example, can be used as photosensitive resins.

As for the resins with a photosensitive group added to a portion of a thermosetting resin, those wherein the thermosetting group of the above-described thermosetting resins and a methacrylic acid and acrylic acid are acrylated, etc., can be implemented. In addition, for thermoplastic resins, phenoxy resin, polyethersulfone (PES), polysulfone (PSF), polyphenylenesulfone (PPS), polyphenylenesulfide (PPES), polyphenyleneether (PPE), polyetherimide (PI), etc., can be implemented.

With respect to specific combinations for resin complexes usable for an organic insulating layer, phenol resin/polyethersulfone, polyimide resin/polysulfone, epoxy resin/polyethersulfone, epoxy resin/phenoxy resin, acrylic resin/phenoxy resin, epoxy resin wherein a portion of the epoxy group is acrylated/polyethersulfone, etc., for example, may be implemented.

Moreover, the type of the exposure method, and the development method for the resist used when the first wiring is formed with a damascene method and formed on an inorganic insulating layer are not particularly limited so long as they are a resist, an exposure method, and a development method used in the semiconductor manufacture process.

A method of forming the first wiring is not limited to a damascene method. For example, it may be that a metal layer is formed on the first insulating layer by sputtering, etc., and this metal layer is patterned with etching to form the first wiring, etc., to form the first wiring. In this case, the first wiring is formed on the surface of the first insulating layer.

A method for forming an organic insulating layer is not particularly limited, and a method for coating a pre-hardened resin by a spin coater, a curtain coater, etc., and a method for forming a resin layer by thermocompression bonding of a resin film may be used. The method for hardening a resin is not limited to thermosetting.

The method for forming an opening in an organic insulating layer is not limited to a exposure and development treatment. For example, a method for forming an opening by a laser treatment may be used. In this example, a method using an excimer laser, a UV-YAG laser, a carbon dioxide gas laser, etc., may be implemented.

Obviously, numerous modifications and variations of the present invention are possible in light of the above teachings. It is therefore to be understood that within the scope of the appended claims, the invention may be practiced otherwise than as specifically described herein.

What is claimed is:

1. An interposer comprising:
a substrate;
a conductor portion formed inside the substrate, the conductor portion having a first thickness;
at least one insulating layer formed on the substrate and on the conductor portion;
a signal wiring portion formed inside the at least one insulating layer or on the at least one insulating layer and providing a linear current path that extends parallel to a surface of the at least one insulating layer, wherein the signal wiring portion having a second thickness which is less than the first thickness;
a first pad that is configured to receive an electronic part, and that is formed on an outermost insulating layer of the at least one insulating layer; and
a connection conductor formed in the at least one insulating layer and providing a linear current path that extends directly from the conductor portion through the at least one insulating layer and to the first pad.

2. An interposer as set forth in claim 1, wherein the first pad is configured to supply power to an electronic part.

3. An interposer as set forth in claim 1, wherein the substrate is composed of silicon.

4. An interposer as set forth in claim 1, wherein the connection conductor includes a first via conductor.

5. An interposer as set forth in claim 4, wherein the connection conductor includes a plurality of via conductors that are linearly laminated.

6. An interposer as set forth in claim 1, wherein the conductor portion is planar layer formed within a recess of the substrate so as to form a power plane layer.

7. An interposer as set forth in claim 1, wherein the conductor portion is a wiring configured to supply power to an electronic part.

8. An interposer as set forth in claim 1, further comprising a second pad that is configured to transfer signals to an electronic part, and that is formed on the outermost insulating layer of the at least one insulating layer,
 wherein the signal wiring portion includes a first wiring formed in the at least one insulating layer on the substrate and on the conductor portion or on a surface of the at least one insulation layer, and
 wherein the second pad and the first wiring are electrically connected via a second via conductor.

9. An interposer as set forth in claim 8, wherein the connection conductor includes a first via conductor, and the first via conductor is larger in diameter than the second via conductor.

10. An interposer as set forth in claim 8,
 wherein the signal wiring portion includes a second wiring formed on the outermost insulating layer of the at least one insulating layer,
 wherein the second wiring includes the second pad, and
 wherein the second wiring and the first wiring are electrically connected by the second via conductor.

11. An interposer as set forth in claim 10, wherein the connection conductor includes a first via conductor, and the first via conductor is larger in diameter than the second via conductor.

12. An interposer as set forth in claim 1,
 wherein the substrate includes a through hole that passes through the substrate from a bottom surface of the substrate to a recess within the substrate that houses the conductor portion, and
 wherein the through hole includes a through hole-electrode that is electrically connected to the connection conductor.

13. An interposer as set forth in claim 1, wherein the at least one insulating layer includes
 an inorganic insulating layer that is formed of an inorganic material and that is formed on the substrate and on the conductor portion, and
 an organic insulating layer that is formed of an organic material and that is formed on the inorganic insulating layer.

14. An interposer as set forth in claim 13, wherein the first wiring is formed in the inorganic insulating layer such that a surface of the inorganic insulating layer and a surface of the first wiring are disposed substantially on the same plane.

15. An interposer as set forth in claim 13, wherein the second pad or the second wiring and the second pad are formed on an outermost surface of the organic insulating layer.

\* \* \* \* \*